US012671365B2

(12) United States Patent
Nomura

(10) Patent No.: US 12,671,365 B2
(45) Date of Patent: Jun. 30, 2026

(54) OPERATIONAL AMPLIFIER

(71) Applicant: ROHM CO., LTD., Kyoto (JP)

(72) Inventor: Naohiro Nomura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 682 days.

(21) Appl. No.: 18/068,131

(22) Filed: Dec. 19, 2022

(65) Prior Publication Data

US 2023/0208360 A1 Jun. 29, 2023

(30) Foreign Application Priority Data

Dec. 24, 2021 (JP) ................................. 2021-210826

(51) Int. Cl.
H03F 3/45 (2006.01)
H03F 1/02 (2006.01)
(52) U.S. Cl.
CPC ....... H03F 1/0205 (2013.01); H03F 3/45273 (2013.01)
(58) Field of Classification Search
CPC ............... H03F 1/0205; H03F 3/45273; H03F 2203/30006; H03F 2203/30009; H03F 3/303; H03F 3/45192
USPC ................................................. 330/251–261
See application file for complete search history.

(56) References Cited

U.S. PATENT DOCUMENTS

2007/0170993 A1* 7/2007 Zhang ................... H03F 3/3015
330/292

FOREIGN PATENT DOCUMENTS

JP    H06196942 A    7/1994
JP    2008211623 A   9/2008

OTHER PUBLICATIONS

JPO Notice of Reasons for Refusal for corresponding JP Application No. 2021-210826; issued Nov. 11, 2025.

* cited by examiner

*Primary Examiner* — Andrea Lindgren Baltzell
*Assistant Examiner* — Khiem D Nguyen
(74) *Attorney, Agent, or Firm* — CANTOR COLBURN LLP

(57) ABSTRACT

An operational amplifier includes a differential input stage that amplifies a differential input signal to generate an intermediate signal; an amplification stage including an output transistor that is connected between an output terminal and a fixed voltage line, and is driven according to the intermediate signal; and an assist circuit, wherein the assist circuit includes: a first transistor connected in parallel with the output transistor; and a drive circuit that drives the first transistor according to a gate voltage of the output transistor.

16 Claims, 19 Drawing Sheets

OPERATIONAL AMPLIFIER

CROSS-REFERENCE TO RELATED APPLICATION

The present invention claims priority under 35 U.S.C. § 119 to Japanese Patent Application No. 2021-210826, filed on Dec. 24, 2021, the entire contents of which are incorporated herein by reference.

TECHNICAL FIELD

The present disclosure relates to an operational amplifier.

BACKGROUND

An operational amplifier (differential amplifier) is used to amplify a difference between two input voltages. The size of an output transistor in an output stage of the operational amplifier is designed according to an expected maximum output current. In the class AB output stage, the amount of bias current and the size of the output transistor are also closely related. Therefore, an operational amplifier with a large maximum output current requires a large bias current, resulting in large current consumption.

SUMMARY

The present disclosure has been made under such circumstances, and some embodiments of the present disclosure provide an operational amplifier capable of achieving both low current consumption and high output current.

According to one embodiment of the present disclosure, there is provided an operational amplifier comprising: a differential input stage that amplifies a differential input signal to generate an intermediate signal; an amplification stage including an output transistor that is connected between an output terminal and a fixed voltage line, and is driven according to the intermediate signal; and an assist circuit, wherein the assist circuit includes: a first transistor connected in parallel with the output transistor; and a drive circuit that drives the first transistor according to a gate voltage of the output transistor.

According to another embodiment of the present disclosure, there is provided an operational amplifier comprising: a differential input stage that amplifies a differential input signal to generate an intermediate signal; an amplification stage including a low-side transistor that is connected between an output terminal and a ground line, and is driven according to the intermediate signal; and an assist circuit, wherein the assist circuit includes: a first transistor connected in parallel with the low-side transistor; a second transistor that includes a source connected to the ground line and is biased to flow a constant current; a third transistor that includes a gate connected to a gate of the low-side transistor and a source connected to a drain of the second transistor; a current mirror circuit that returns a current flowing through the third transistor to source the current to a gate of the first transistor; and a fourth transistor that includes a source connected to the ground line and a drain connected to the gate of the first transistor, and is biased to flow a constant current.

According to another embodiment of the present disclosure, there is provided an operational amplifier comprising: a differential input stage that amplifies a differential input signal to generate an intermediate signal; an amplification stage including a high-side transistor that is connected between an output terminal and a power supply line, and is driven according to the intermediate signal; and an assist circuit, wherein the assist circuit includes: a first transistor connected in parallel with the high-side transistor; a second transistor that includes a source connected to the power supply line and is biased to flow a constant current; a third transistor that includes a gate connected to a gate of the high-side transistor and a source connected to a drain of the second transistor; a current mirror circuit that returns a current flowing through the third transistor to sink the current from a gate of the first transistor; and a fourth transistor that includes a source connected to the power supply line and a drain connected to the gate of the first transistor, and is biased to flow a constant current.

Arbitrary combinations of the above constituent elements and mutual replacement of constituent elements and expressions among methods, devices, systems, etc. are also effective as the present disclosure or aspects of the present disclosure. Furthermore, the description in this section (SUMMARY) does not describe all the essential features of the present disclosure, and thus sub-combinations of those described features can also belong to the present disclosure.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
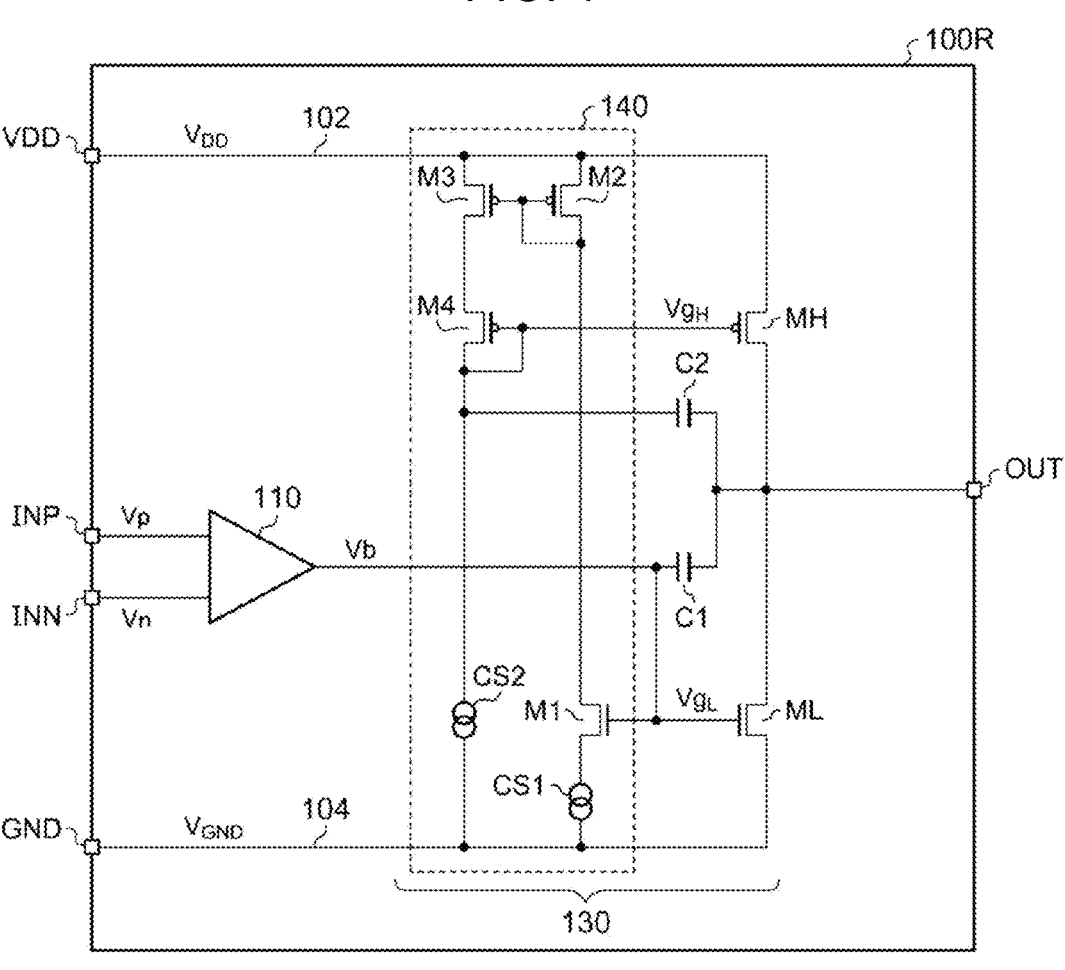
FIG. 1 is a circuit diagram of an operational amplifier according to a comparative technique.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

(Overview of Embodiments)

An overview of some exemplary embodiments of the present disclosure is described. This overview presents, in simplified form, some concepts of one or more embodiments, as a prologue to the detailed description which will be presented later, and for the purpose of basic understanding of the embodiments, but it is not intended to limit the scope of the invention or the disclosure. This overview is not a comprehensive overview of all possible embodiments, and it is intended to neither identify key elements of all embodiments nor delineate the scope of some or all aspects. For the sake of convenience, "an embodiment" may be used to refer to one embodiment (example or modification) or a plurality of embodiments (examples or modifications) disclosed herein.

An operational amplifier according to an embodiment includes: a differential input stage that amplifies a differential input signal to generate an intermediate signal; an amplification stage including an output transistor that is connected between an output terminal and a fixed voltage line and is driven according to the intermediate signal; and an assist circuit. The assist circuit includes: a first transistor connected in parallel with the output transistor; and a drive circuit that drives the first transistor according to a gate voltage of the output transistor.

According to this configuration, a maximum output current can be increased by providing the first transistor in parallel with the output transistor and flowing a current through the first transistor. Since the first transistor is controlled by the drive circuit which is independent of a bias circuit for the output transistor, it is not necessary to flow a large steady bias current through the first transistor and the drive circuit when an output current of the operational amplifier is small, so that an increase in an operation current can also be suppressed. Therefore, it is possible to achieve both low current consumption and high output current.

In one embodiment, the output transistor may be a low-side transistor of an N-channel MOSFET (Metal Oxide Semiconductor Field Effect Transistor), the fixed voltage line may be a ground line, and the drive circuit may include a first current source that sources a first current according to the gate voltage of the output transistor to a gate of the first transistor, and a second current source that sinks a second current from the gate of the first transistor.

In one embodiment, the first current source may include a second transistor that includes a source connected to the ground line and is biased to flow a constant current, a third transistor that includes a gate connected to a gate of the low-side transistor and a source connected to a drain of the second transistor, and a current mirror circuit that returns a current flowing through the third transistor to source current to the gate of the first transistor.

In one embodiment, the second current source may include a fourth transistor that includes a source connected to the ground line and a drain connected to the gate of the first transistor, and is biased to flow a constant current.

In one embodiment, the drive circuit may further include a fifth transistor that includes a gate connected to the gate of the low-side transistor and a source connected to the gate of the first transistor.

In one embodiment, the drive circuit may further include a sixth transistor that includes a gate and a drain connected to a drain of the fifth transistor, and a source connected to a power supply line.

In one embodiment, the output transistor may be a P-type high-side transistor, the fixed voltage line may be a power supply line, and the drive circuit may include a first current source that sinks a first current according to the gate voltage of the output transistor from a gate of the first transistor, and a second current source that sources a second current to the gate of the first transistor.

In one embodiment, the first current source may include a second transistor that includes a source connected to the power supply line and is biased to flow a constant current, a third transistor that includes a gate connected to a gate of the high-side transistor and a source connected to a drain of the second transistor, and a current mirror circuit that returns a current flowing through the third transistor to sink the current from the gate of the first transistor.

In one embodiment, the second current source may include a fourth transistor that includes a source connected to the power supply line and a drain connected to the gate of the first transistor, and is biased to flow a constant current.

In one embodiment, the drive circuit may further include a fifth transistor that includes a gate connected to the gate of the high-side transistor and a source connected to the gate of the first transistor.

In one embodiment, the drive circuit may further include a sixth transistor that includes a gate and a drain connected to a drain of the fifth transistor, and a source connected to the ground line.

An operational amplifier according to an embodiment includes: a differential input stage that amplifies a differential input signal to generate an intermediate signal; an amplification stage including a low-side transistor that is connected between an output terminal and a ground line and is driven according to the intermediate signal; and an assist circuit. The assist circuit includes: a first transistor connected in parallel with the low-side transistor; a second transistor that includes a source connected to the ground line and is biased to flow a constant current; a third transistor that includes a gate connected to a gate of the low-side transistor and a source connected to a drain of the second transistor; a current mirror circuit that returns a current flowing through the third transistor to source the current to a gate of the first transistor; and a fourth transistor that includes a source connected to the ground line and a drain connected to the gate of the first transistor, and is biased to flow a constant current.

In one embodiment, the assist circuit may further include a fifth transistor that includes a gate connected to the gate of the low-side transistor and a source connected to the gate of the first transistor, and a sixth transistor that includes a gate and a drain connected to a drain of the fifth transistor, and a source connected to a power supply line.

An operational amplifier according to an embodiment includes: a differential input stage that amplifies a differential input signal to generate an intermediate signal; an amplification stage including a high-side transistor that is connected between an output terminal and a power supply line and is driven according to the intermediate signal; and an assist circuit. The assist circuit includes: a first transistor connected in parallel with the high-side transistor; a second transistor that includes a source connected to the power supply line and is biased to flow a constant current; a third transistor that includes a gate connected to a gate of the high-side transistor and a source connected to a drain of the second transistor; a current mirror circuit that returns a current flowing through the third transistor to sink the current from a gate of the first transistor; and a fourth transistor that includes a source connected to the power supply line and a drain connected to the gate of the first transistor, and is biased to flow a constant current.

In one embodiment, the assist circuit may further include a fifth transistor that includes a gate connected to the gate of the high-side transistor and a source connected to the gate of the first transistor, and a sixth transistor that includes a gate and a drain connected to a drain of the fifth transistor, and a source connected to a ground line.

In one embodiment, the operational amplifier may be integrated on one semiconductor substrate. The term "integrated" is intended to include both of a case where all circuit elements are formed on a semiconductor substrate and a case where main elements of a circuit are integrated on a semiconductor substrate. In addition, some resistors, capacitors, or the like for adjustment of a circuit constant may be provided outside a semiconductor substrate.

Embodiments

Preferred embodiments of the present disclosure will now be described with reference to the drawings. Same or equivalent components, members, and processes illustrated in each drawing are given same reference numerals and a repeated description thereof will be properly omitted. Further, the embodiments are presented by way of example only, and are not intended to limit the present disclosure, and any feature or combination thereof described in the embodiments may not necessarily be essential to the present disclosure.

In the present disclosure, "a state where a member A is connected to a member B" includes a case where the members A and B are physically and directly connected or even a case where the members A B are indirectly connected through any other member that does not affect an electrical connection state between the members A and B or does not impair functions and effects achieved by combinations of the members A and B.

Similarly, "a state where a member C is connected (installed) between a member A and a member B" includes a case where the members A and C or the members B and C are indirectly connected through any other member that does not affect an electrical connection state between the members A and C or the members B and C, or does not impair function and effects achieved by combinations of the members A and C or the members B and C, in addition to a case where the members A and C or the members B and C are directly connected.

Further, in the present disclosure, symbols attached to electrical signals such as voltage signals, current signals, etc., or circuit elements such as resistors, capacitors, inductors, etc., denote respective voltage values, current values, or circuit constants (resistance, capacitance, and inductance) if necessary.

First, basic configuration of an operational amplifier including a class AB output stage will be described with reference to FIG. 1.

FIG. 1 is a circuit diagram of an operational amplifier 100R according to a comparative technique. The operational amplifier 100R receives differential input signals Vp and Vn at differential input terminals INP and INN, respectively, and outputs an amplified output signal from an output terminal OUT. The operational amplifier 100R may be a transconductance amplifier of a voltage output type or a current output type. A power supply voltage $V_{DD}$ is supplied to a power supply terminal VDD of the operational amplifier 100R, and a ground terminal GND is grounded.

The operational amplifier 100R includes a power supply line 102, a ground line 104, a differential input stage 110, and an amplification stage 130. The power supply line 102 is connected to the power supply terminal VDD, and the ground line 104 is connected to the ground terminal GND.

The differential input stage 110 amplifies the differential input signals Vp and Vn to generate an intermediate signal Vb.

The amplification stage 130 includes a high-side transistor MH and a low-side transistor ML which are output transistors, capacitors C1 and C2, and a bias circuit 140. The high-side transistor MH is a P-type (PMOS) transistor provided between the output terminal OUT and the power supply line 102 which is a fixed voltage line, and the low-side transistor ML is an N-type (NMOS) transistor provided between the output terminal OUT and the ground line 104 which is a fixed voltage line.

The high-side transistor MH and the low-side transistor ML are driven according to the intermediate signal Vb.

In FIG. 1, the intermediate signal Vb is applied to a gate of the low-side transistor ML. That is, in this configuration, a gate voltage $Vg_L$ of the low-side transistor ML is equal to the intermediate signal Vb.

The bias circuit 140 includes, for example, current sources CS1 and CS2 and transistors M1 to M4. The intermediate signal Vb, that is, the gate voltage $Vg_L$ of the low-side transistor ML, is applied to a gate of the transistor M1. The transistors M2 and M3 form a current mirror circuit, which returns a current flowing through the transistor M1. A gate and a drain of transistor M4 are connected to a gate of the high-side transistor MH.

The above is the configuration of the operational amplifier 100R. Next, its operation will be described, and problems that occur with the operational amplifier 100R according to the comparative technique will be described.

Figure 2:
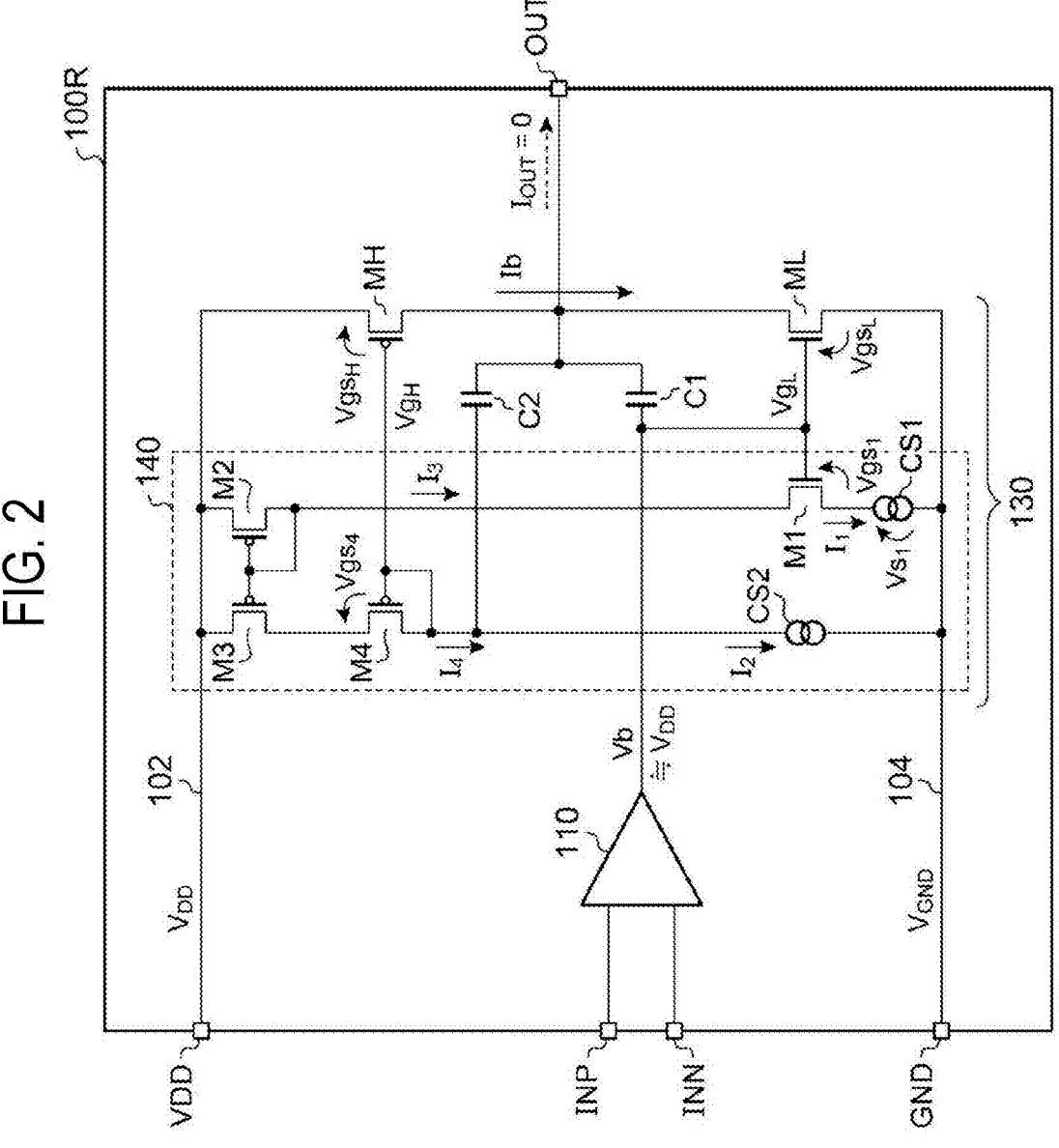
FIG. 2 is a diagram for explaining a steady state of the operational amplifier.

FIG. 2 is a diagram for explaining a steady state of the operational amplifier 100R. In the present disclosure, the steady state means a state in which both the high-side transistor MH and the low-side transistor ML are turned on to flow a current. Here, for ease of understanding, considering a state in which a current $I_{OUT}$ flowing through the output terminal OUT in the operational amplifier 100R is zero, a state in which an equal bias current Ib flows through the high-side transistor MH and the low-side transistor ML will be described.

It is assumed that the operational amplifier 100R forms a feedback system together with an external circuit of the operational amplifier 100R and a voltage and a current of each node are stabilized.

Let currents of the current sources CS1 and CS2 be $I_1$ and $I_2$, respectively. A gate-source voltage $Vgs_L$ of the low-side transistor ML is the intermediate signal Vb. Assuming that a voltage across the current source CS1 is $Vs_1$, a gate-source voltage $Vgs_1$ of the transistor M1 is equal to a difference between the intermediate signal Vb and the voltage $Vs_1$ across the current source CS1 ($Vgs_1 = Vb - Vs_1$).

That is, the bias current Ib flowing through the low-side transistor ML is determined by the voltage of the intermediate signal Vb.

$$Ib = \beta_n/2 \times (Vb - V_{thn})^2 \qquad (1)$$

$\beta_n = \mu_n C_{ox} \, W/L$
$V_{thn}$: threshold voltage of NMOS transistor
$\mu_n$: mobility of NMOS transistor
$C_{ox}$: unit capacity of oxide film of NMOS transistor
L: channel length of NMOS transistor
W: channel width of NMOS transistor A current $I_3$ flowing through the transistor M1 is expressed by Equation (2).

$$I_3 = \beta_n/2 \times (Vgs_1 - V_{thn})^2 = \beta_n/2 \times (Vb - Vs_1 - V_{thn})^2 \qquad (2)$$

However, a capability $I_1$ of the current source CS1 is sufficiently larger than $I_3$, and a relationship of the current $I_3$ being much less than the capability $I_1$ ($I_3 \ll I_1$) is established.

The current $I_3$ controlled by the transistor M1 is returned by the current mirror circuit including the transistors M2 and M3, to flow a current $I_4$ through the transistor M4. Equation (3) is established between a gate-source voltage $Vgs_4$ of the transistor M4 and the current $I_4$.

$$I_4 = \beta_p/2 \times (Vgs_4 - V_{thp})^2 \qquad (3)$$

$\beta_p = \mu_p C_{ox} \, W/L$
$V_{thp}$: threshold voltage of PMOS transistor
$\mu_p$: mobility of PMOS transistor
$C_{ox}$: unit capacity of oxide film of PMOS transistor
L: channel length of PMOS transistor
W: channel width of PMOS transistor A capability $I_2$ of the current source CS2 connected to the drain of the transistor M4 is sufficiently larger than the current $I_4$, and the relationship of the current $I_4$ being much less than the capability $I_2$ ($I_4 \ll I_2$) is established. The gate-source voltage $Vgs_4$ of the transistor M4 is obtained by modifying the equation (3).

$$Vgs_4 = \sqrt{(2I_4/\mu_p)} + V_{thp} \qquad (4)$$

A gate-source voltage $Vgs_H$ of the high-side transistor MH is determined by the voltage $Vgs_4$, and the bias current Ib also flows through the high-side transistor MH. From the equation (1), the bias current Ib flowing through the low-side transistor ML is determined by a size ratio W/L of the low-side transistor ML.

Figure 3:
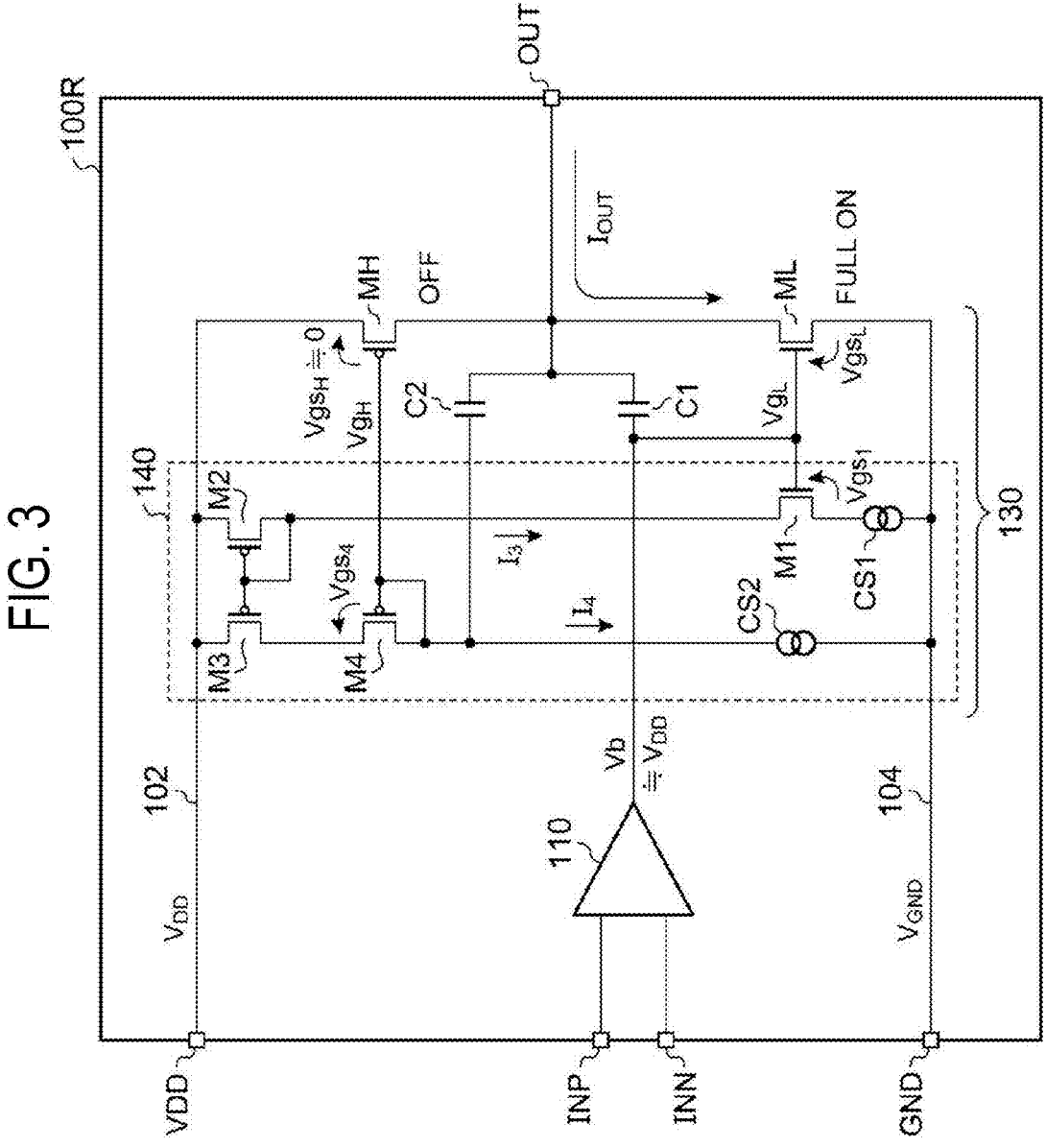
FIG. 3 is a diagram for explaining a sink mode of the operational amplifier.

FIG. 3 is a diagram for explaining a sink mode of the operational amplifier 100R. In the present disclosure, the sink mode refers to a state in which the low-side transistor ML sinks (sucks in) an output current $I_{OUT}$ from a load connected to the output terminal OUT while the high-side transistor MH is substantially turned off. Conversely, a source mode refers to a state in which the high-side transistor MH sources (discharges) the output current $I_{OUT}$ to the load connected to the output terminal OUT while the low-side transistor ML is substantially turned off.

When the intermediate signal Vb rises, the output current $I_{OUT}$ increases. The output current $I_{OUT}$ when the gate-source voltage $Vgs_L$ of the low-side transistor ML is maximized is referred to as a maximum sink current. As the output current $I_{OUT}$ increases, the current $I_3$ flowing through the transistor M1 also increases. The current $I_3$ is returned by the current mirror circuit including the transistors M2 and M3, to supply the current $I_4$ to the transistor M4. The current source CS2 is connected to the drain of the transistor M4, but since the capability $I_2$ of the current source CS2 is much less than the capability $I_1$ of the current source CS1 ($I_2 \ll I_1$), a source voltage of the transistor M4 is the power supply voltage $V_{DD}$. At this time, the gate-source voltage $Vgs_H$ of the high-side transistor MH becomes small, and the high-side transistor MH is substantially turned off to enter the sink mode.

The maximum sink current in this sink mode is also determined by the size ratio W/L of the low-side transistor ML, like the bias current Ib. That is, in the comparative technique, both the maximum sink current and the bias current Ib are determined according to the size ratio W/L of the low-side transistor ML. Therefore, if the maximum sink current is increased, the bias current is also increased, resulting in an increase in circuit area.

On the other hand, a maximum source current is determined by the size ratio W/L of the high-side transistor MH. That is, in the comparative technique, both the maximum source current and the bias current are determined according to a size ratio W/L of the high-side transistor MH. Therefore, if the maximum source current is increased, the bias current Ib is also increased, resulting in an increase in circuit area.

Hereinafter, a technique that achieves all of a large maximum sink current and/or maximum source current, a small circuit area, and/or a small bias current will be described.

First Embodiment

Figure 4:
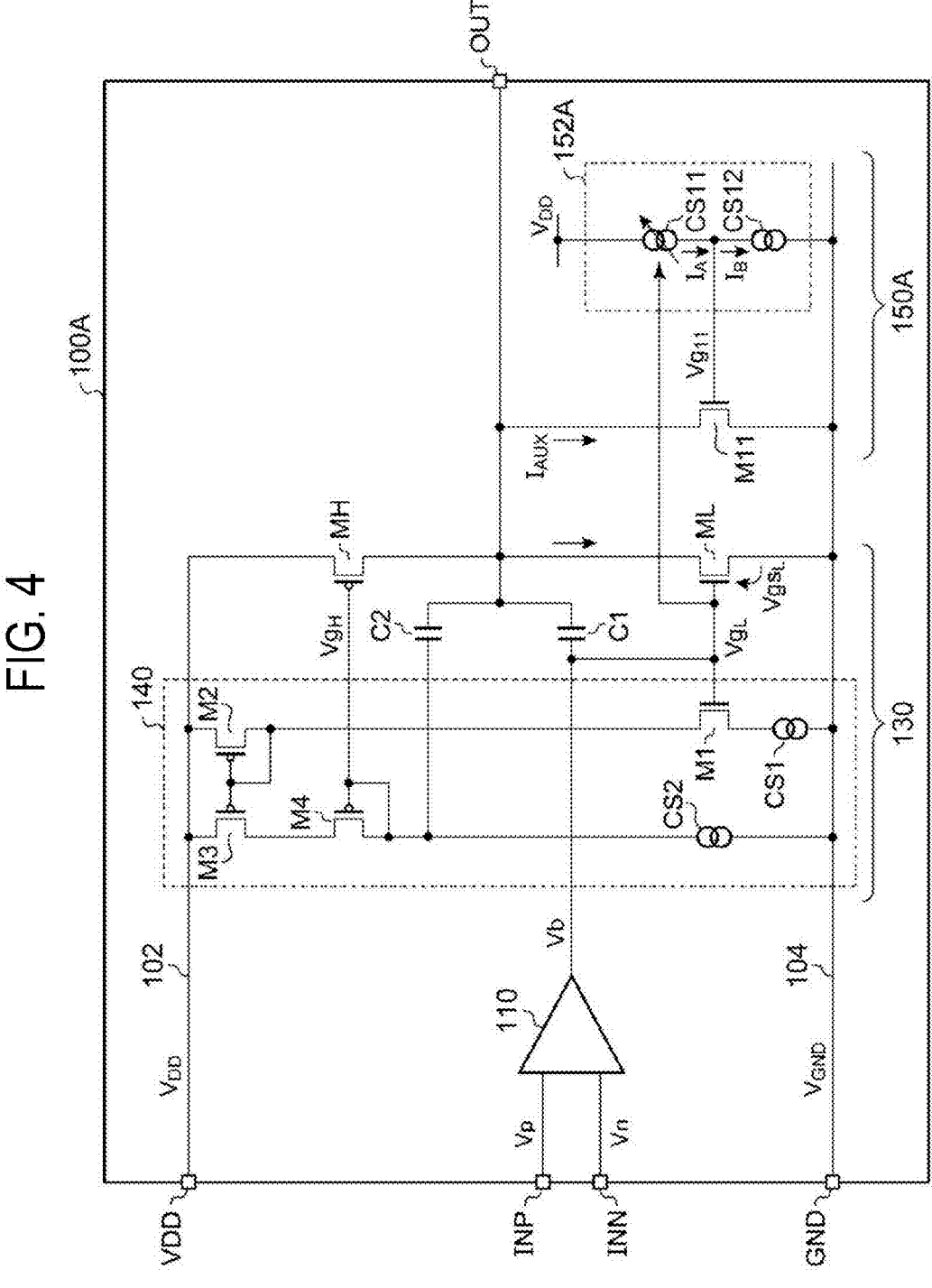
FIG. 4 is a circuit diagram of an operational amplifier according to a first embodiment.

FIG. 4 is a circuit diagram of an operational amplifier 100A according to a first embodiment. The operational amplifier 100A, which is integrated on one semiconductor substrate, includes the differential input stage 110, the amplification stage 130, and an assist circuit 150A.

The assist circuit 150A becomes active in a sink mode of the operational amplifier 100A and sinks an auxiliary current $I_{AUX}$ from the output terminal OUT. The assist circuit 150A includes a first transistor M11 and a drive circuit 152A.

The first transistor M11 is an NMOS transistor of the same type as the low-side transistor ML, and is connected in parallel with the low-side transistor ML.

The drive circuit 152A drives the first transistor M11 according to the gate voltage $Vg_L$ of the low-side transistor ML, that is, the intermediate signal Vb. Specifically, the drive circuit 152A turns off the first transistor M11 when the gate voltage $Vg_L$ of the low-side transistor ML is low, that is, when the gate-source voltage $Vgs_L$ of the low-side transistor ML is low. When the gate voltage $Vg_L$ increases, that is, when the gate-source voltage $Vgs_L$ of the low-side transistor ML increases, the drive circuit 152A turns on the first transistor M11 to increase a sink current using the first transistor M11.

For example, the drive circuit 152A includes a first current source CS11 and a second current source CS12. The first current source CS11 sources a first current $I_4$ corresponding to the gate voltage $Vg_L$ of the low-side transistor ML to a gate of the first transistor M11. The second current source CS12 sinks a second current $I_B$ from the gate of the first transistor M11.

The above is the configuration of the operational amplifier 100A. According to this operational amplifier 100A, the first current $I_A$ is larger than the second current $I_B$ ($I_A > I_B$), when the gate voltage $Vg_L$ of the low-side transistor ML rises to operate in the sink mode. As a result, a gate voltage $Vg_{11}$ of the first transistor M11 increases to turn on the first transistor M11. At this time, the total current of a current flowing through the low-side transistor ML and a current (referred to as an auxiliary current) $I_{AUX}$ flowing through the first transistor M11 is sunk from the output terminal OUT. That is, the maximum sink current can be increased by adding the assist circuit 150A.

The first transistor M11 is turned on when operating in the sink mode, but in a state where the sink current is not so large and in a state where the first transistor M11 operates in the source mode, in other words, in a state where the gate voltage $Vg_L$ is lower than a certain voltage (e.g., Vm), the first transistor M11 is preferably turned off. This relationship can be designed by dependence between the gate voltage $Vg_L$ and the first current IA, and current amount of the second current $I_B$.

It is assumed that the first current $I_A$ is expressed by Equation (5) as a function of the gate voltage $Vg_L$ (gate-source voltage $Vgs_L$).

$$I_A = f(Vg_L) \quad (5)$$

Preferably, the drive circuit 152A is designed such that a relationship of the first current $I_A$ being larger than the second current $I_B$ ($I_A > I_B$) is established when the gate voltage $Vg_L$ is larger than the certain voltage Vm ($Vg_L > Vm$), and a relationship of the first current $I_A$ being less than the second current $I_B$ ($I_A < I_B$) is established when the gate voltage $Vg_L$ is less than the certain voltage Vm ($Vg_L < Vm$). As a result, when the gate voltage $Vg_L$ drops, since the gate voltage $Vg_{11}$ of the first transistor M11 drops, the first transistor M11 is turned off to decrease the auxiliary current $I_{AUX}$ to zero.

Figure 5:
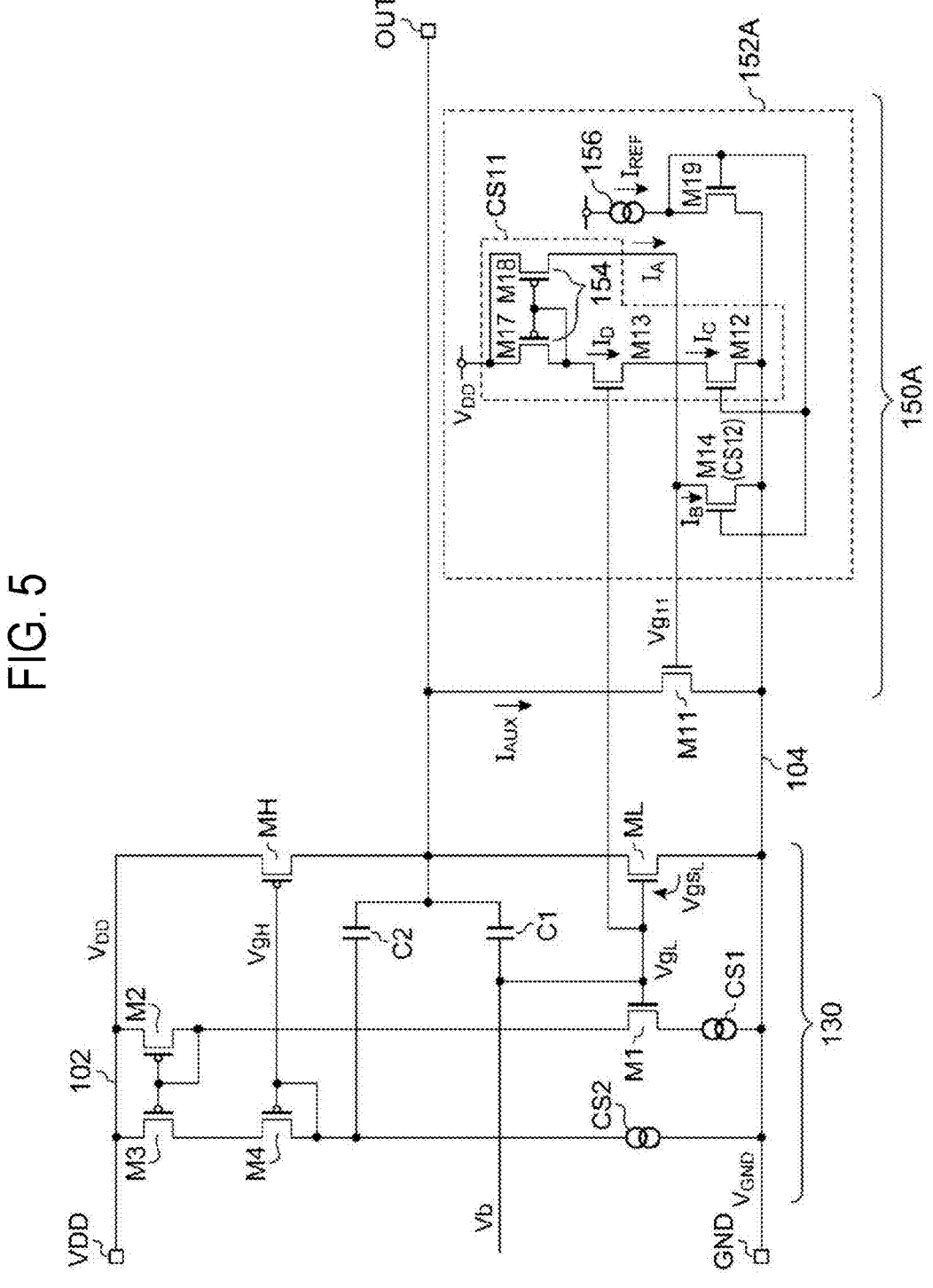
FIG. 5 is a circuit diagram showing a specific configuration example of an assist circuit of FIG. 4.

FIG. 5 is a circuit diagram showing a specific configuration example of the assist circuit 150A of FIG. 4. Only the amplification stage 130 and the assist circuit 150A are shown in FIG. 5.

The first current source CS11 includes a second transistor M12, a third transistor M13, and a current mirror circuit 154. The second transistor M12 includes a source connected to the ground line 104 and is biased to flow a constant current. Specifically, the second transistor M12 forms a current mirror circuit together with a transistor M19 and is biased to flow a current $I_C$ corresponding to a reference current $I_{REF}$ flowing through a reference current source 156.

The third transistor M13 includes a gate connected to the gate of the low-side transistor ML, and a source connected to a drain of the second transistor M12. As a state of the third transistor M13 changes according to the gate voltage $Vg_L$, a current $I_D$ flowing through the third transistor M13 changes. When the third transistor M13 is fully turned on, the current $I_D$ is substantially equal to the current $I_C$ ($I_D \approx I_C$), and when the third transistor M13 is turned off, the current $I_D$ is substantially equal to zero ($I_D \approx 0$).

The current mirror circuit 154 returns the current $I_D$ flowing through the third transistor M13 to source the returned current, as the first current $I_A$, to the gate of the first transistor M11. The current mirror circuit 154 includes PMOS transistors M17 and M18.

The second current source CS12 includes a fourth transistor M14. The fourth transistor M14 includes a source connected to the ground line 104 and a drain connected to the gate of the first transistor M11, and is biased to flow the constant second current $I_B$. Specifically, the fourth transistor M14 forms a current mirror circuit together with the transistor M19 and is biased to flow the current $I_B$ corresponding to the reference current $I_{REF}$ flowing through the reference current source 156.

It should be noted that the configuration of the first current source CS11 and the second current source CS12 shown in FIG. 5 is an example, and it should be understood by those skilled in the art that other configurations may be adopted.

Second Embodiment

Figure 6:
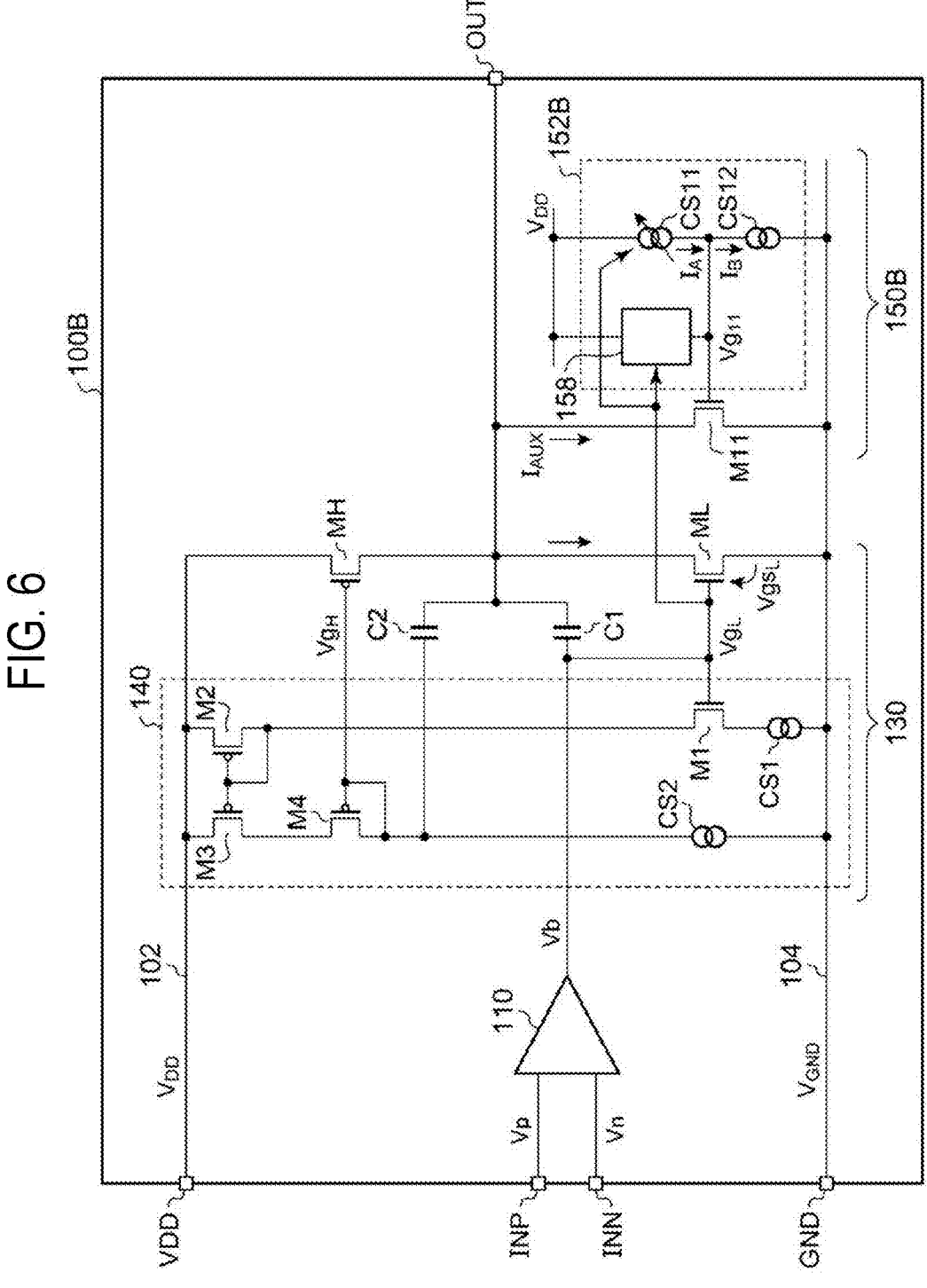
FIG. 6 is a circuit diagram of an operational amplifier according to a second embodiment.

FIG. 6 is a circuit diagram of an operational amplifier 100B according to a second embodiment. The operational amplifier 100B includes the differential input stage 110, the amplification stage 130, and an assist circuit 150B. The assist circuit 150B includes the first transistor M11 and a drive circuit 152B. The drive circuit 152B includes a clamp circuit 158 in addition to the drive circuit 152A of FIG. 4.

The clamp circuit 158 forcibly lowers the gate voltage $Vg_{11}$ of the first transistor M11 in a state in which the gate voltage $Vg_L$ of the low-side transistor ML is low, that is, in a state (steady state or source mode) where the operational amplifier 100A does not operate in the sink mode, to set a gate-source voltage $Vgs_{11}$ of the first transistor M11 to be lower than the threshold voltage $V_{thn}$. For example, the clamp circuit 158 may be configured to shift the gate voltage $Vg_L$ by a predetermined voltage width $\Delta V$ to a low voltage side and apply it to the gate of the first transistor M11.

By adding the clamp circuit 158, since the gate-source voltage $Vgs_{11}$ of the first transistor M11 is kept lower than the threshold voltage $V_{thn}$ in the state (steady state or source mode) in which the gate voltage $Vg_L$ is low, the auxiliary current $I_{AUX}$ flowing through the first transistor M11 can be cut off.

The gate voltage $Vg_{11}$ of the first transistor M11 is a voltage across the second current source CS12. Therefore, by adding the clamp circuit 158, the voltage across the second current source CS12 is set to be lower than a minimum operation voltage of the second current source CS12 in the state (steady state or source mode) in which the gate voltage $Vg_L$ is low. Then, the second current $I_B$ can be made zero, further reducing the circuit current.

Figure 7:
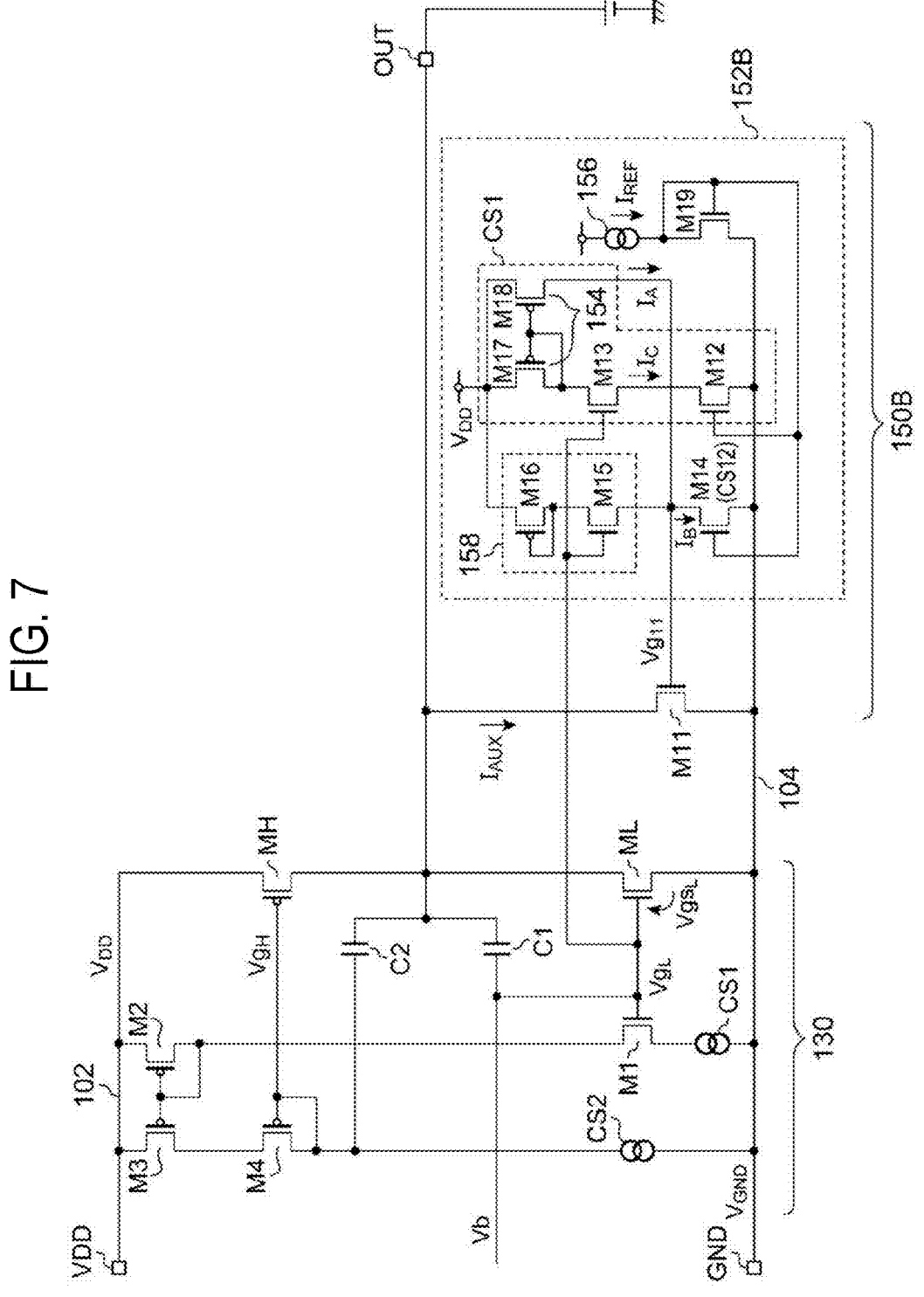
FIG. 7 is a circuit diagram showing a specific configuration example of an assist circuit of FIG. 6.

FIG. 7 is a circuit diagram showing a specific configuration example of the assist circuit 150B of FIG. 6. The clamp circuit 158 of the drive circuit 152B includes a fifth transistor M15 and a sixth transistor M16.

The fifth transistor M15 and the sixth transistor M16 operate as a source follower circuit. When the gate voltage $Vg_L$ of the low-side transistor ML drops, a source voltage of the transistor M15, that is, the gate-source voltage $Vgs_{11}$ of the first transistor M11, drops. As a result, the gate-source voltage $Vgs_{11}$ of the first transistor M11 becomes smaller than the threshold voltage $V_{thn}$, and the first transistor M11 can be turned off.

Figure 8:
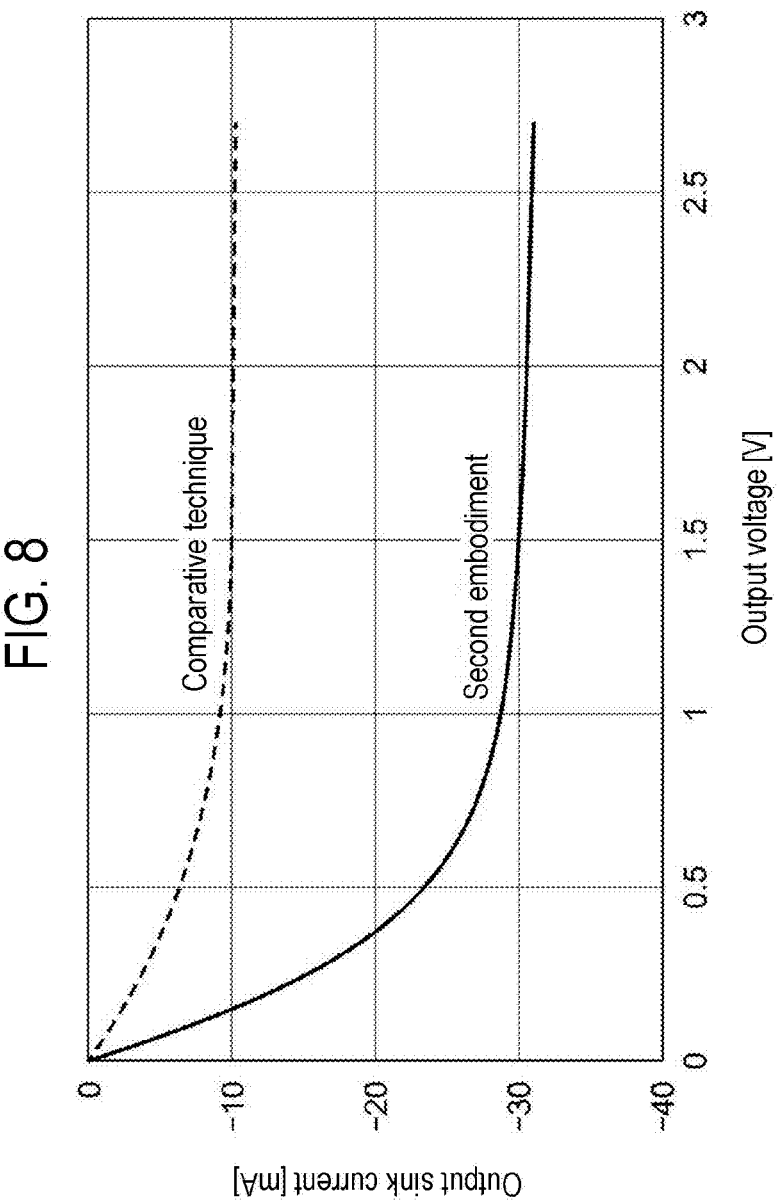
FIG. 8 is a diagram showing sink currents (simulation results) of the operational amplifier according to the second embodiment (FIG. 7) and the operational amplifier of the comparative technique.

FIG. 8 is a diagram showing sink currents (simulation results) of the operational amplifier 100B according to the second embodiment (FIG. 7) and the operational amplifier 100R of the comparative technique. In the simulation, the power supply voltage $V_{DD}$ was set to 2.7 V and the output voltage $V_{OUT}$ was swept between 0 and 2.7 V. In the second embodiment, the maximum sink current is increased from −10 mA to −30 mA, which is about three times as compared to the comparative technique.

Figure 9:
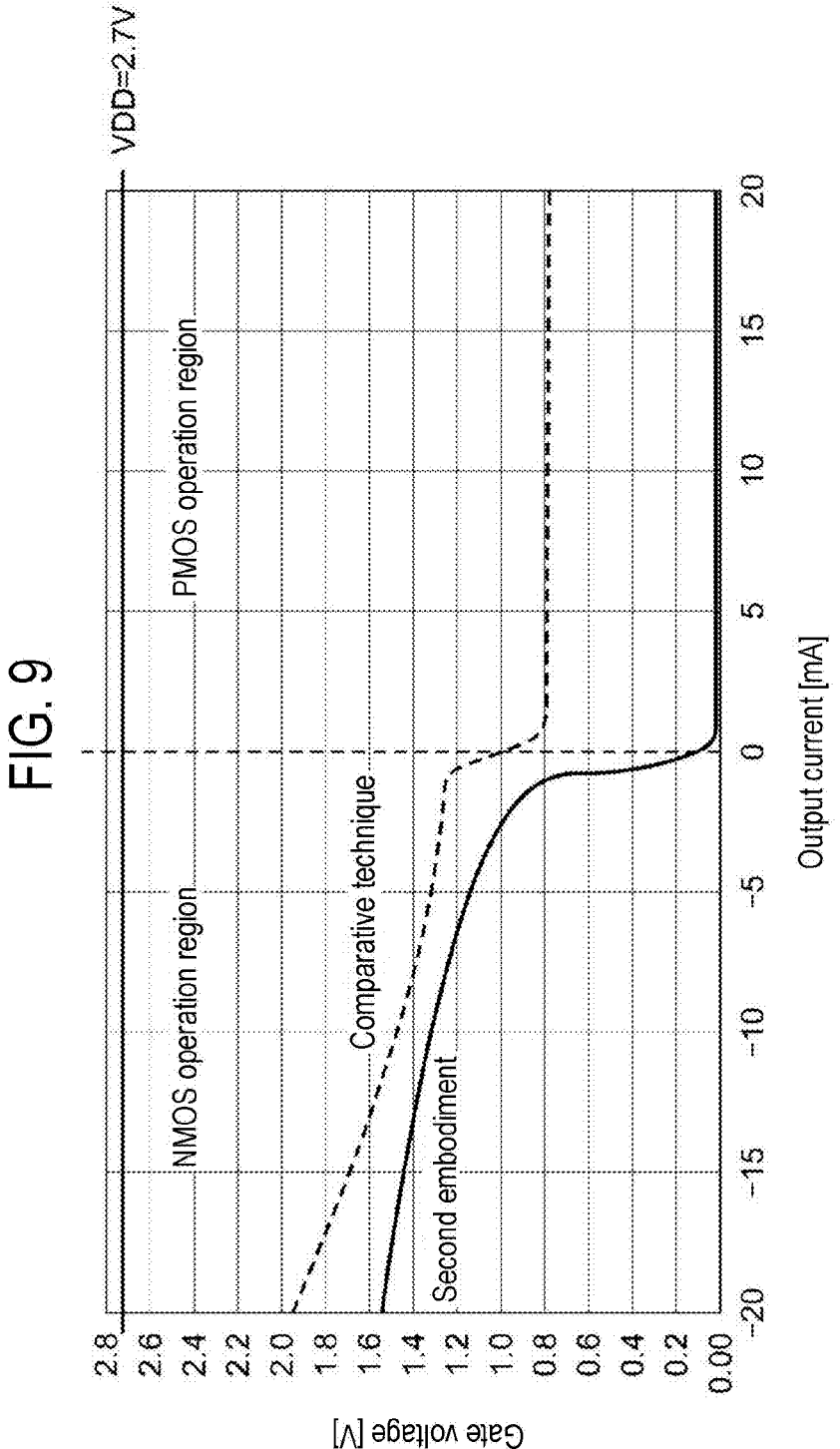
FIG. 9 is a diagram showing gate voltages $Vg_L$ (simulation results) of low-side transistors of the operational amplifier according to the second embodiment (FIG. 7) and the operational amplifier of the comparative technique.

FIG. 9 is a diagram showing the gate voltages Vg (simulation results) of the low-side transistors ML of the operational amplifier 100B according to the second embodiment (FIG. 7) and the operational amplifier 100R of the comparative technique. In a PMOS operation region where the output current $I_{OUT}$ is positive, the high-side transistor, which is a PMOS transistor, is dominant, and in an NMOS operation region where the output current $I_{OUT}$ is negative, the low-side transistor, which is an NMOS transistor, is dominant.

In the comparative technique, in the PMOS operating region, the gate voltage $Vg_L$ of the low-side transistor ML does not drop completely to zero and therefore, a small amount of current flows through the low-side transistor ML. In contrast, in the second embodiment, in the PMOS operating region, the gate voltage $Vg_L$ of the low-side transistor ML drops to zero. As a result, the low-side transistor ML is completely turned off, thereby reducing the current.

Third Embodiment

Figure 10:
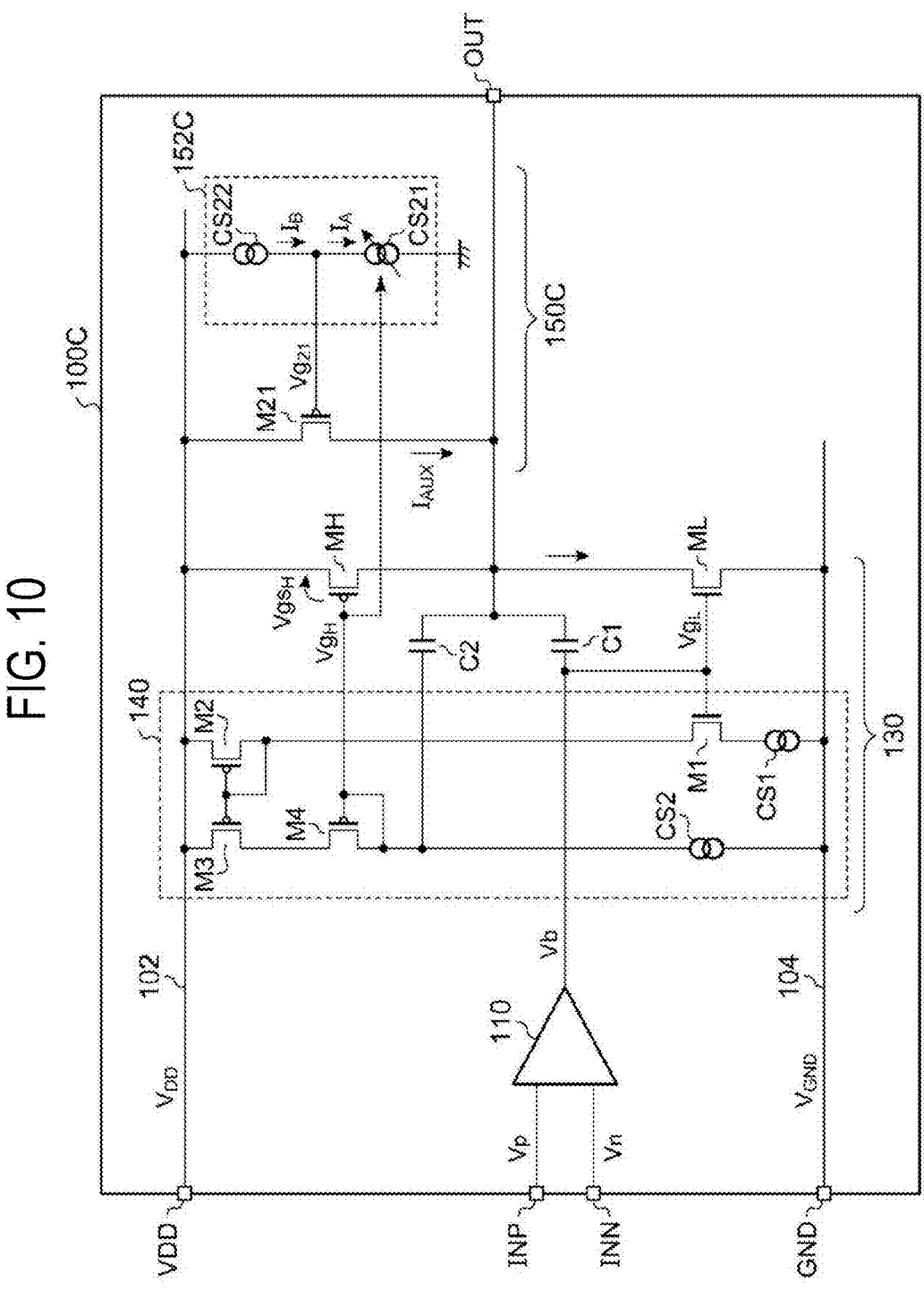
FIG. 10 is a circuit diagram of an operational amplifier according to a third embodiment.

FIG. 10 is a circuit diagram of an operational amplifier 100C according to a third embodiment. The operational amplifier 100C, which is integrated on one semiconductor substrate, includes an assist circuit 150C in addition to the differential input stage 110 and the amplification stage 130.

The assist circuit 150C becomes active in a source mode of the operational amplifier 100C and sources an auxiliary current $I_{AUX}$ from the output terminal OUT. The assist circuit 150C includes a first transistor M21 and a drive circuit 152C. The assist circuit 150C includes a configuration in which the assist circuit 150A of FIG. 4 is inverted.

The first transistor M21 is a PMOS transistor of the same type as the high-side transistor MH, and is connected in parallel with the high-side transistor MH.

The drive circuit 152C drives the first transistor M21 according to a gate voltage $Vg_H$ of the high-side transistor MH. Specifically, the drive circuit 152C turns off the first transistor M21 when the gate voltage $Vg_H$ of the high-side transistor MH is high, that is, when the gate-source voltage $Vgs_H$ of the high-side transistor MH is low. When the gate voltage $Vg_H$ of the high-side transistor MH decreases, that is, when the gate-source voltage $Vgs_H$ of the high-side transistor MH increases, the drive circuit 152C turns on the first transistor M21 to increase a source current using the first transistor M21.

For example, the drive circuit 152C includes a first current source CS21 and a second current source CS22. The first current source CS21 sinks a first current $I_A$ according to the gate voltage $Vg_H$ of the high-side transistor MH from a gate of the first transistor M21. The first current $I_A$ has a positive correlation with the gate-source voltage $Vgs_H$ of the high-side transistor MH, and thus has a negative correlation with the gate voltage $Vg_H$ of the high-side transistor MH. The second current source CS22 sources a second current $I_B$ independent of the gate voltage $Vg_H$ to the gate of the first transistor M21.

The above is the configuration of the operational amplifier 100C. According to this operational amplifier 100C, the first current $I_A$ is larger than the second current $I_B$ ($I_A > I_B$), when the gate voltage $Vg_H$ of the high-side transistor MH drops to operate in the source mode. As a result, a gate voltage $Vg_{21}$ of the first transistor M21 decreases to turn on the first transistor M21. At this time, the total current of a current flowing through the high-side transistor MH and a current $I_{AUX}$ (referred to as an auxiliary current) flowing through the first transistor M21 is sourced from the output terminal OUT. That is, the maximum source current can be increased by adding the assist circuit 150C.

Figure 11:
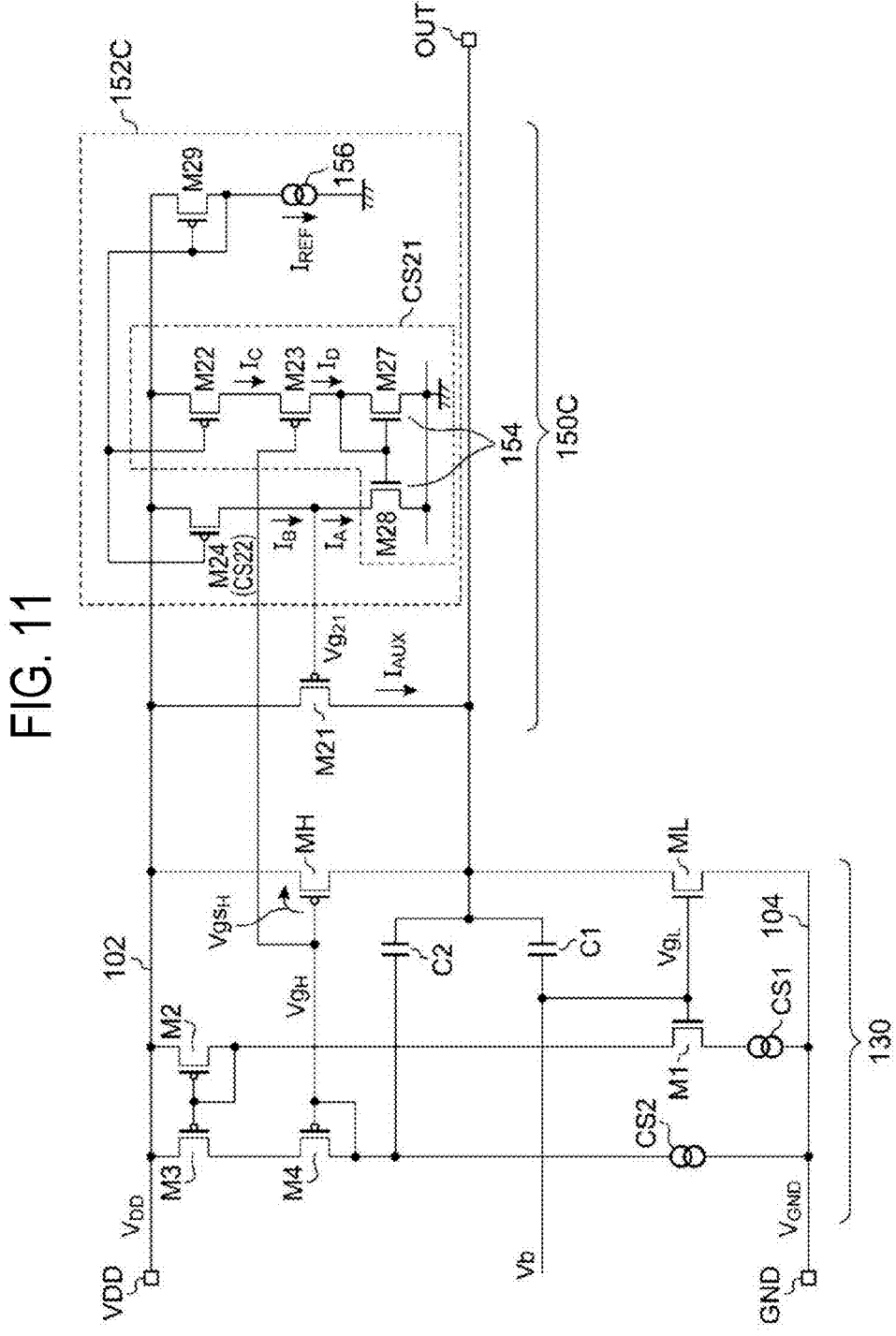
FIG. 11 is a circuit diagram showing a specific configuration example of an assist circuit of FIG. 10.

FIG. 11 is a circuit diagram showing a specific configuration example of the assist circuit 150C of FIG. 10. Only the amplification stage 130 and the assist circuit 150C are shown in FIG. 11. The assist circuit 150C is obtained by reversing conductive type of the transistors forming the assist circuit 150A of FIG. 5.

The first current source CS21 includes a second transistor M22, a third transistor M23, and a current mirror circuit 154. The second transistor M22 includes a source connected to the power supply line 102 and is biased to flow a constant current. Specifically, the second transistor M22 forms a current mirror circuit together with a transistor M29 and is biased to flow the current $I_C$ corresponding to a reference current $I_{REF}$ flowing through a reference current source 156.

The third transistor M23 includes a gate connected to the gate of the high-side transistor MH and a source connected to a drain of the second transistor M22. As a state of the third transistor M23 changes according to the gate voltage $Vg_H$, a current $I_D$ flowing through the third transistor M23 changes. When the third transistor M23 is fully turned on, the current $I_D$ is substantially equal to the current $I_C$ ($I_D \fallingdotseq I_C$), and when the third transistor M23 is turned off, the current $I_D$ is substantially equal to zero ($I_D \fallingdotseq 0$).

The current mirror circuit 154 returns the current $I_D$ flowing through the third transistor M23 to source the returned current, as the first current $I_A$, to the gate of the first transistor M21. The current mirror circuit 154 includes PMOS transistors M27 and M28.

The second current source CS22 includes a fourth transistor M24. The fourth transistor M24 includes a source connected to the power supply line 102 and a drain connected to the gate of the first transistor M21, and is biased to flow the constant second current $I_B$. Specifically, the fourth transistor M24 forms a current mirror circuit together with the transistor M29 and is biased to flow the current $I_B$ corresponding to the reference current $I_{REF}$ flowing through the reference current source 156.

It should be noted that the configuration of the first current source CS21 and the second current source CS22 shown in FIG. 11 is an example, and it should be understood by those skilled in the art that other configurations may be adopted.

Fourth Embodiment

Figure 12:
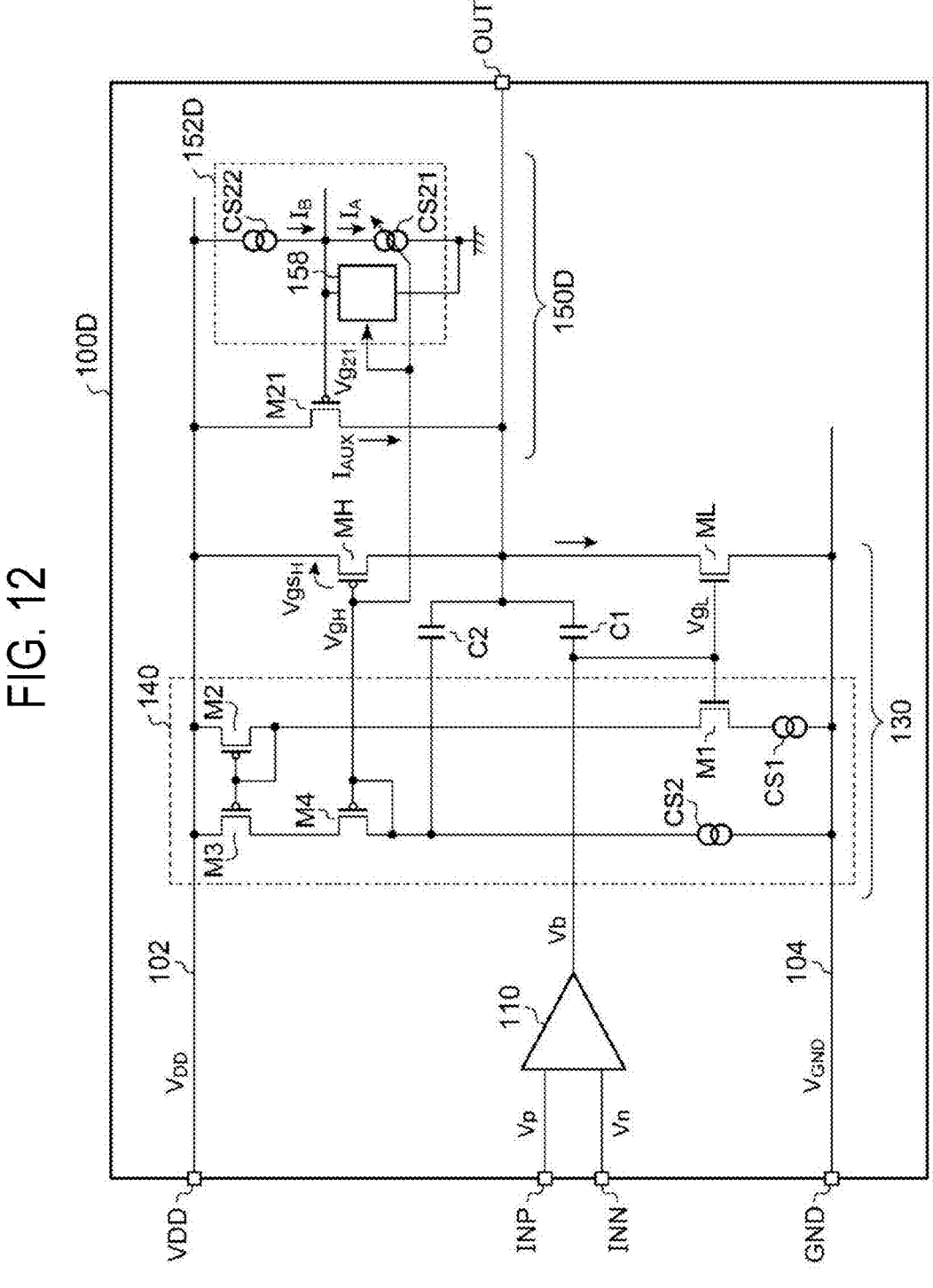
FIG. 12 is a circuit diagram of an operational amplifier according to a fourth embodiment.

FIG. 12 is a circuit diagram of an operational amplifier 100D according to a fourth embodiment. The operational amplifier 100D includes the differential input stage 110, the amplification stage 130, and an assist circuit 150D. The assist circuit 150D includes the first transistor M21 and a drive circuit 152D. The drive circuit 152D includes a clamp circuit 158 in addition to the drive circuit 152C of FIG. 11.

The clamp circuit 158 forcibly raises the gate voltage $Vg_{21}$ of the first transistor M21 in a state in which the gate voltage $Vg_H$ of the high-side transistor MH is high, that is, in a state (steady state or sink mode) where the operational amplifier 100D does not operate in the source mode, to set a gate-source voltage $Vg_{21}$ of the first transistor M21 to be lower than the threshold voltage $V_{thp}$.

For example, the clamp circuit 158 may be configured to shift the gate voltage $Vg_H$ by a predetermined voltage width $\Delta V$ to a high voltage side and apply it to the gate of the first transistor M21.

By adding the clamp circuit 158, since the gate-source voltage $Vgs_{21}$ of the first transistor M21 is kept lower than the threshold voltage $V_{thp}$ in the state (steady state or sink mode) in which the gate voltage $Vg_H$ is high, the auxiliary current $I_{AUX}$ flowing through the first transistor M21 can be cut off.

The gate voltage $Vg_{21}$ of the first transistor M21 is a voltage across the second current source CS22. Therefore, by adding the clamp circuit 158, the voltage across the second current source CS22 is set to be lower than a minimum operation voltage of the second current source CS22 in the state (steady state or sink mode) in which the gate voltage $Vg_H$ is high. Then, the second current $I_B$ can be made zero, thereby further reducing the circuit current.

Figure 13:
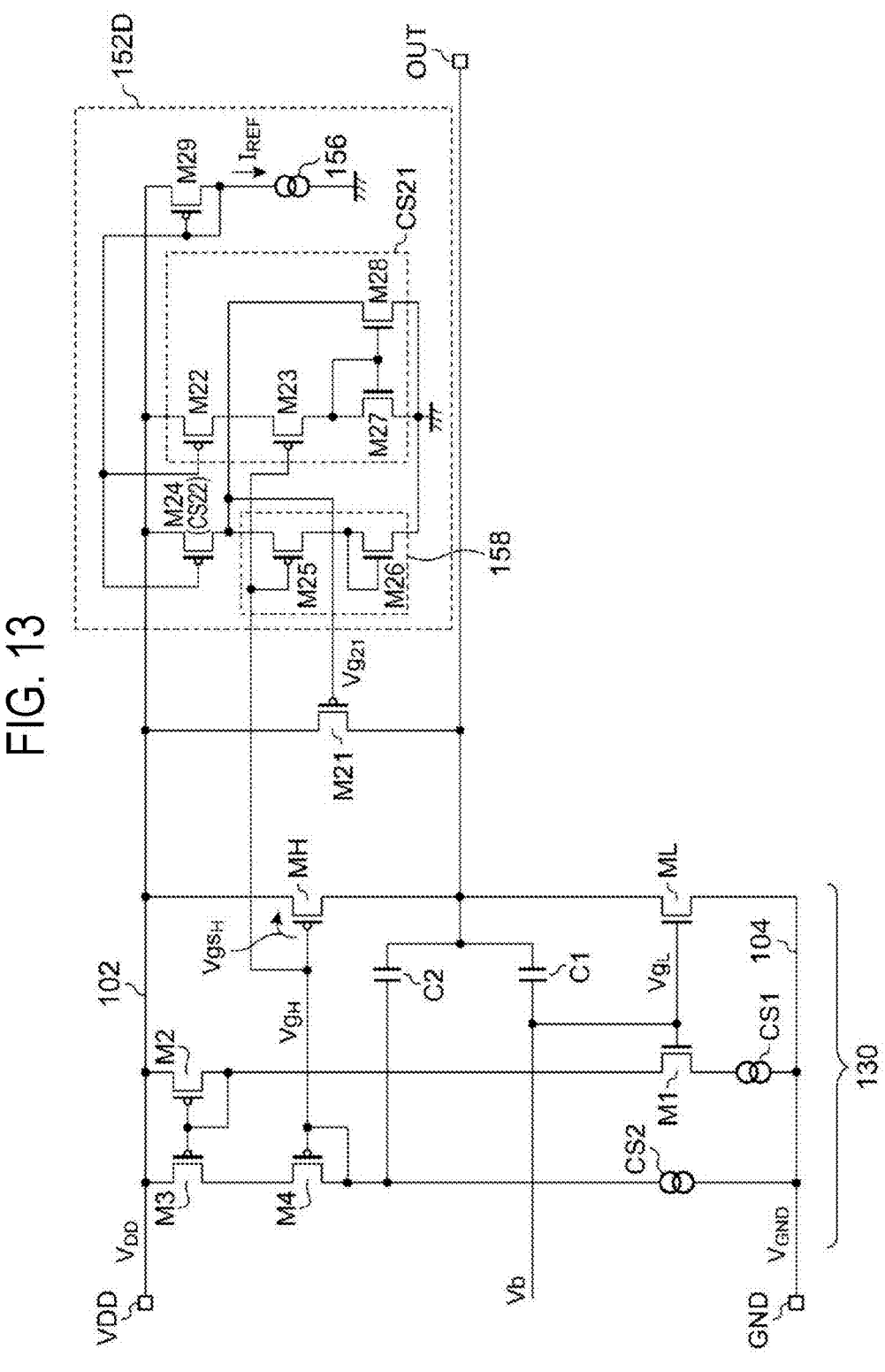
FIG. 13 is a circuit diagram showing a specific configuration example of an assist circuit of FIG. 12.

FIG. 13 is a circuit diagram showing a specific configuration example of the assist circuit 150D of FIG. 12. The clamp circuit 158 of the drive circuit 152D includes a fifth transistor M25 and a sixth transistor M26.

The fifth transistor M25 and the sixth transistor M26 operate as a source follower circuit. When the gate voltage $Vg_H$ of the high-side transistor MH drops, a source voltage of the transistor M25, that is, the gate-source voltage $Vgs_{21}$ of the first transistor M21, drops. As a result, the gate-source voltage $Vgs_{21}$ of the first transistor M21 becomes smaller than the threshold voltage $V_{thp}$, and the first transistor M21 can be turned off.

Figure 14:
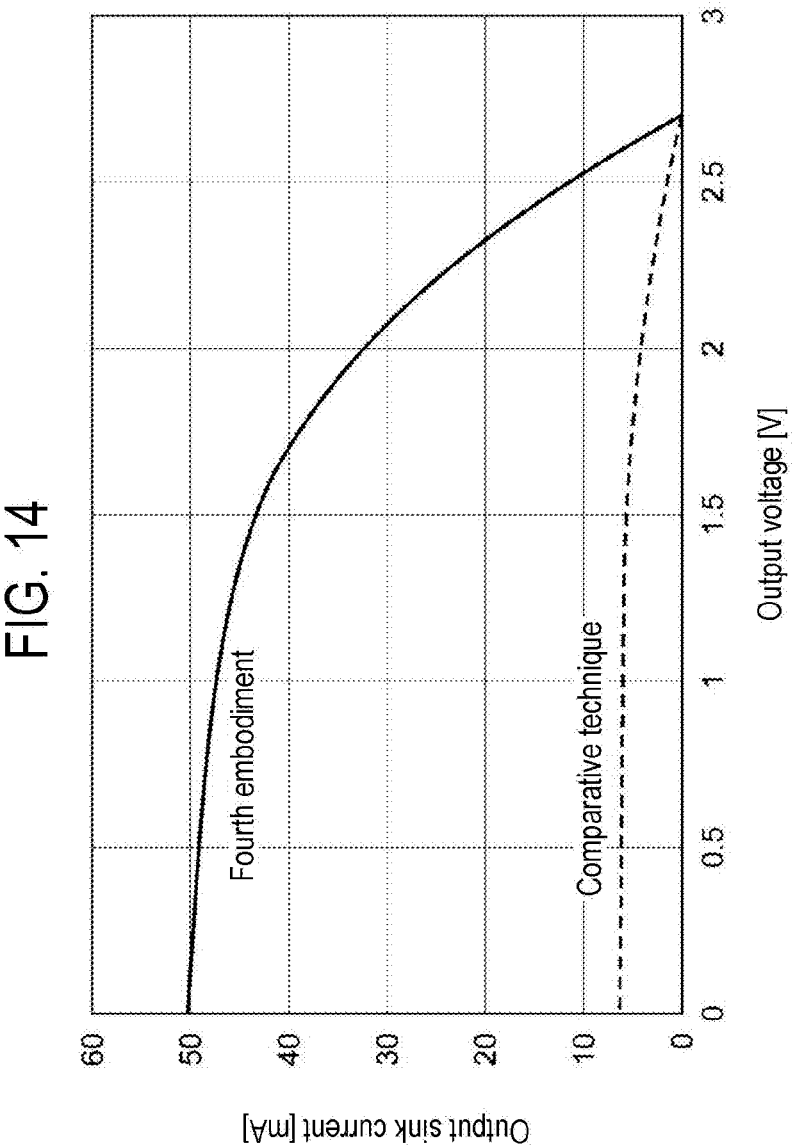
FIG. 14 is a diagram showing source currents (simulation results) of the operational amplifier according to the fourth embodiment (FIG. 12) and the operational amplifier of the comparative technique.

FIG. 14 is a diagram showing source currents (simulation results) of the operational amplifier 100D according to the fourth embodiment (FIG. 12) and the operational amplifier 100R of the comparative technique. In the simulation, the power supply voltage $V_{DD}$ was set to 2.7 V and the output voltage $V_{OUT}$ was swept between 0 and 2.7 V. In the fourth embodiment, the maximum source current is increased from 6 mA to 50 mA, which is about eight times as compared to the comparative technique.

Figure 15:
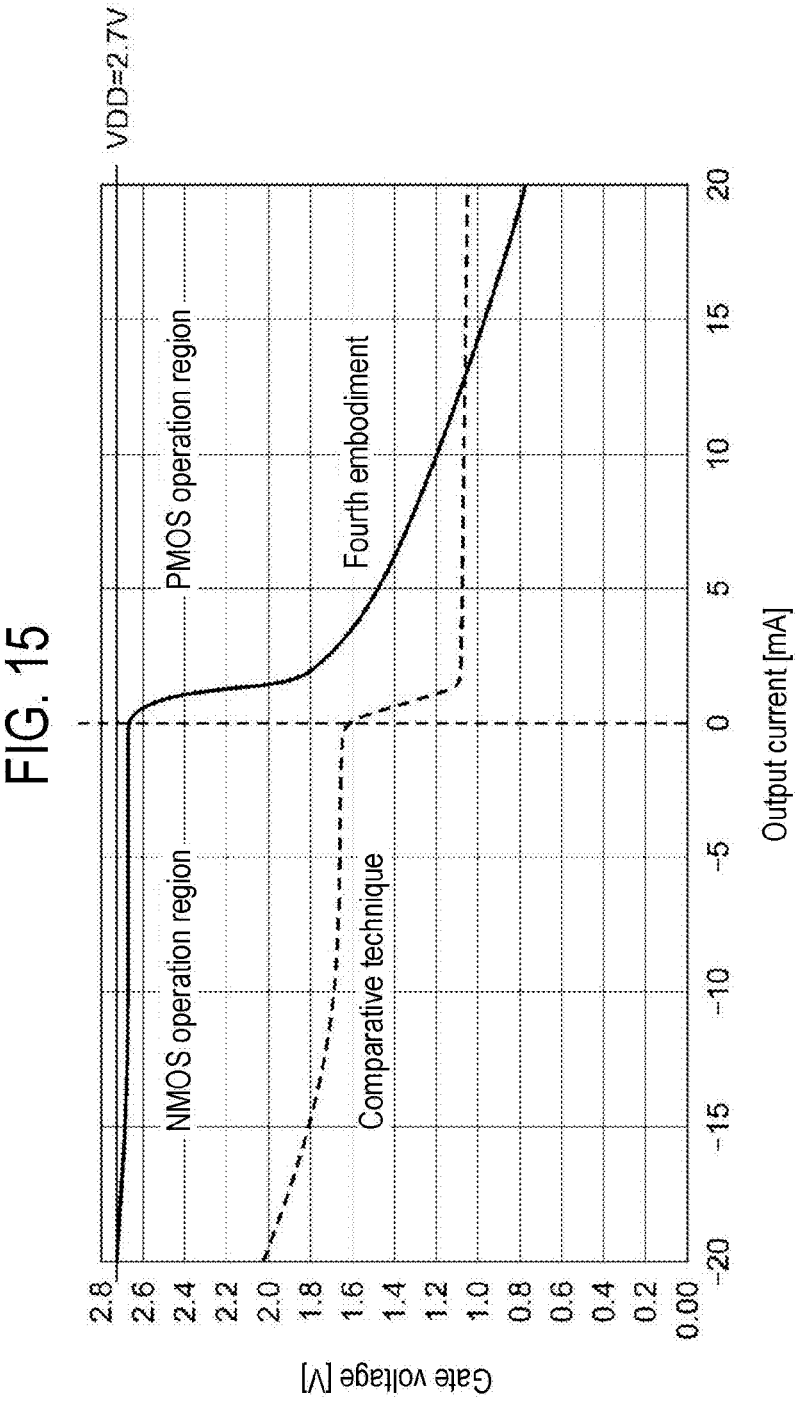
FIG. 15 is a diagram showing gate voltages $Vg_H$ (simulation results) of high-side transistors of the operational amplifier according to the fourth embodiment (FIG. 12) and the operational amplifier of the comparative technique.

FIG. 15 is a diagram showing the gate voltages $Vg_H$ (simulation results) of the high-side transistors MH of the operational amplifier 100D according to the fourth embodiment (FIG. 12) and the operational amplifier 100R of the comparative technique. In a PMOS operation region, the high-side transistor, which is a PMOS transistor, is dominant, and in an NMOS operation region where the output current $I_{OUT}$ is negative, the low-side transistor, which is an NMOS transistor, is dominant.

In the comparative technique, in the NMOS operation region where the output current $I_{OUT}$ is negative, the gate voltage $Vg_H$ of the high-side transistor MH rises only to about 1.6 to 1.8 V, and the gate-source voltage $Vgs_H$ of the high-side transistor MH is about 1 V. Therefore, a small amount of current flows through the high-side transistor MH. In contrast, in the fourth embodiment, in the NMOS operation region, the gate voltage $Vg_H$ of the high-side transistor MH rises to near the power supply voltage $V_{DD}$. As a result, the high-side transistor MH is completely turned off, thereby reducing the current.

Fifth Embodiment

Figure 16:
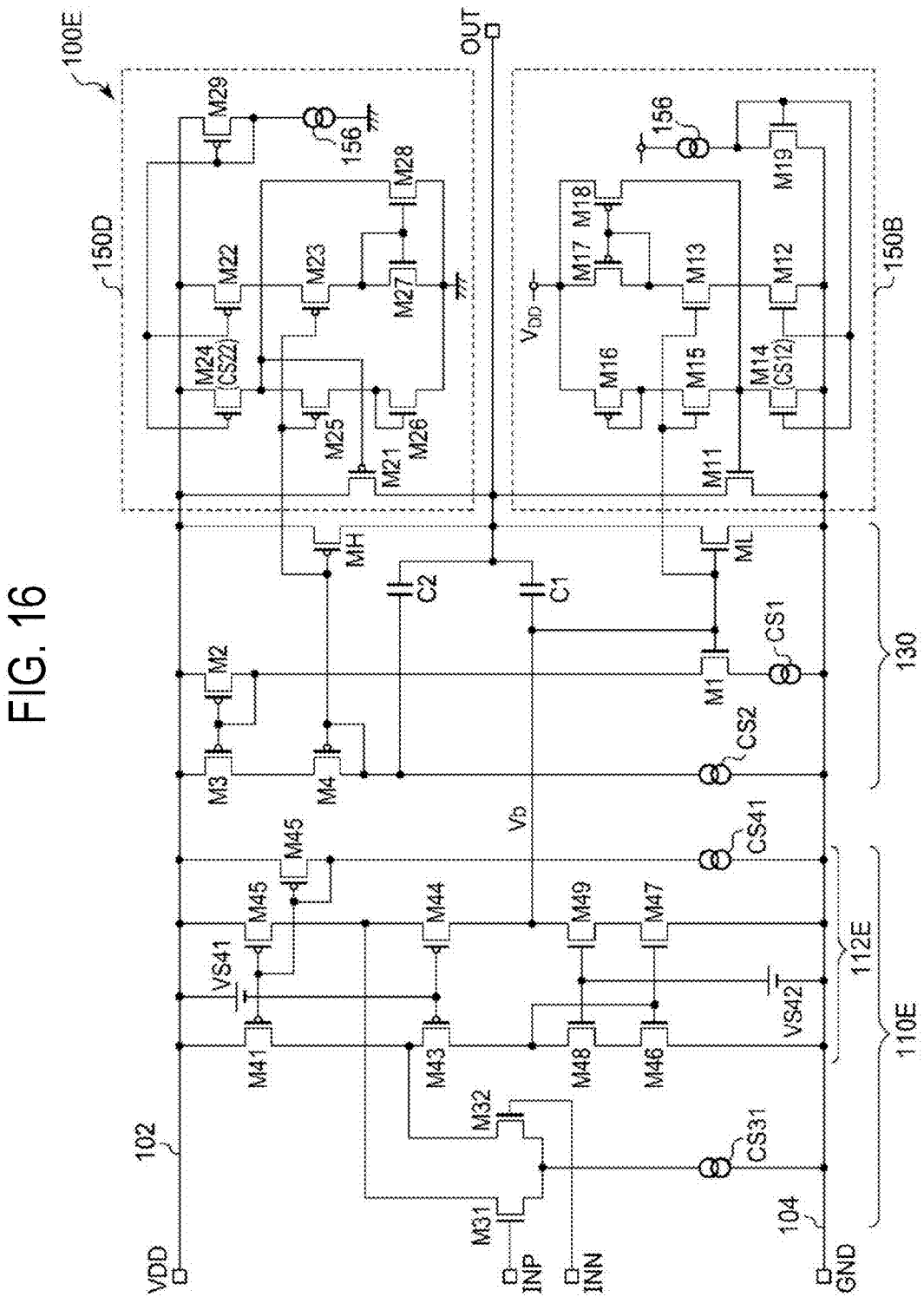
FIG. 16 is a circuit diagram of an operational amplifier according to a fifth embodiment.

FIG. 16 is a circuit diagram of an operational amplifier 100E according to a fifth embodiment. The operational amplifier 100E is an operational amplifier with low current consumption and includes both the assist circuit 150B described in the second embodiment and the assist circuit 150D described in the fourth embodiment.

A differential input stage 110E includes a differential transistor pair M31 and M32, a tail current source CS31, and a folded cascode amplifier circuit 112E. The folded cascode amplifier circuit 112E is an active load of the differential transistor pair M31 and M32 and includes transistors M41 to M49, voltage sources VS41 and VS42, and a current source CS41.

Figure 17:
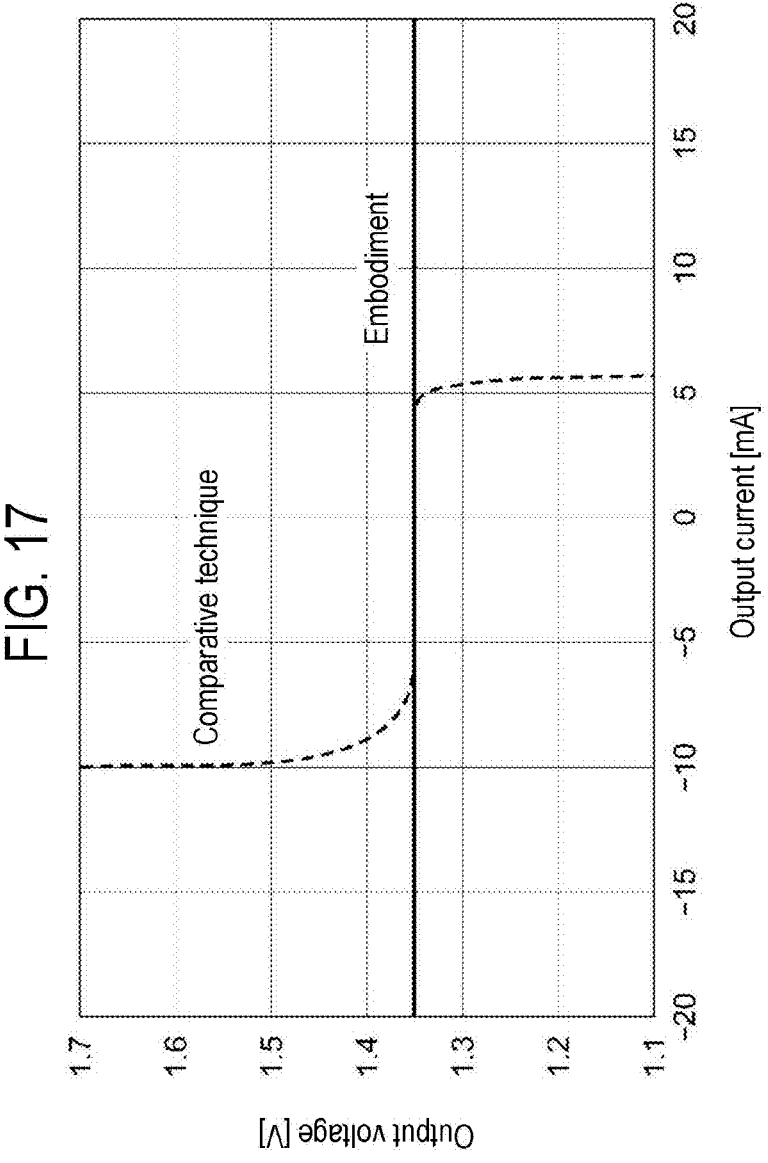
FIG. 17 is a diagram showing load regulation (simulation result) of the operational amplifier of FIG. 16.

FIG. 17 is a diagram showing load regulation (simulation result) of the operational amplifier 100E of FIG. 16. A component is connected to the operational amplifier 100E to form a constant voltage regulator with a target voltage of 1.35 V. A horizontal axis represents a load current, and a vertical axis represents an output voltage $V_{OUT}$. In the comparison technique without the assist circuits 150B and 150D, the output voltage $V_{OUT}$ cannot be maintained at a target level when a source current or a sink current increases.

On the other hand, in the fifth embodiment, by adding the assist circuit 150B, load regulation can be improved in a state where the source current is large. Further, by adding the assist circuit 150D, load regulation can be improved in a state where the sink current is large.

Figure 18:
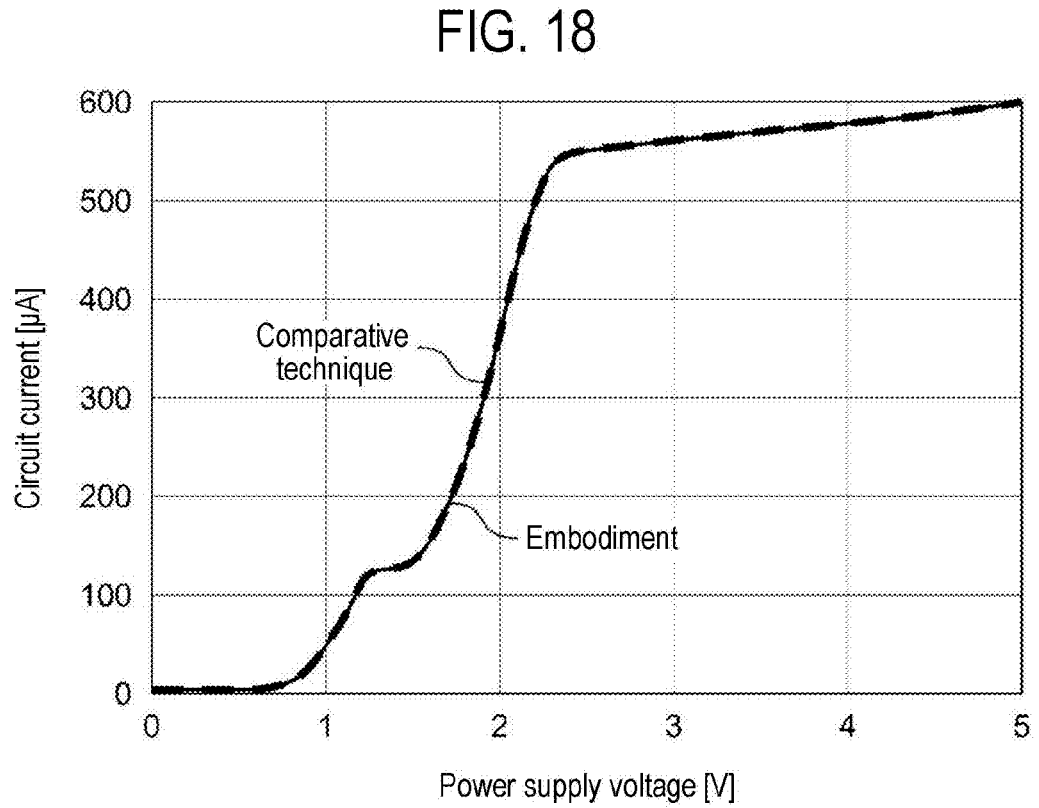
FIG. 18 is a diagram showing a relationship between a power supply voltage and a circuit current in a no-load state of the operational amplifier of FIG. 16.

FIG. 18 is a diagram showing a relationship between a power supply voltage and a circuit current in a no-load state of the operational amplifier 100E of FIG. 16. FIG. 18 shows characteristics of the operational amplifier 100E of FIG. 16 and characteristics of the operational amplifier 100R according to the comparative technique. It can be seen that the addition of the assist circuits 150B and 150D does not increase the circuit current in the no-load state.

Sixth Embodiment

Figure 19:
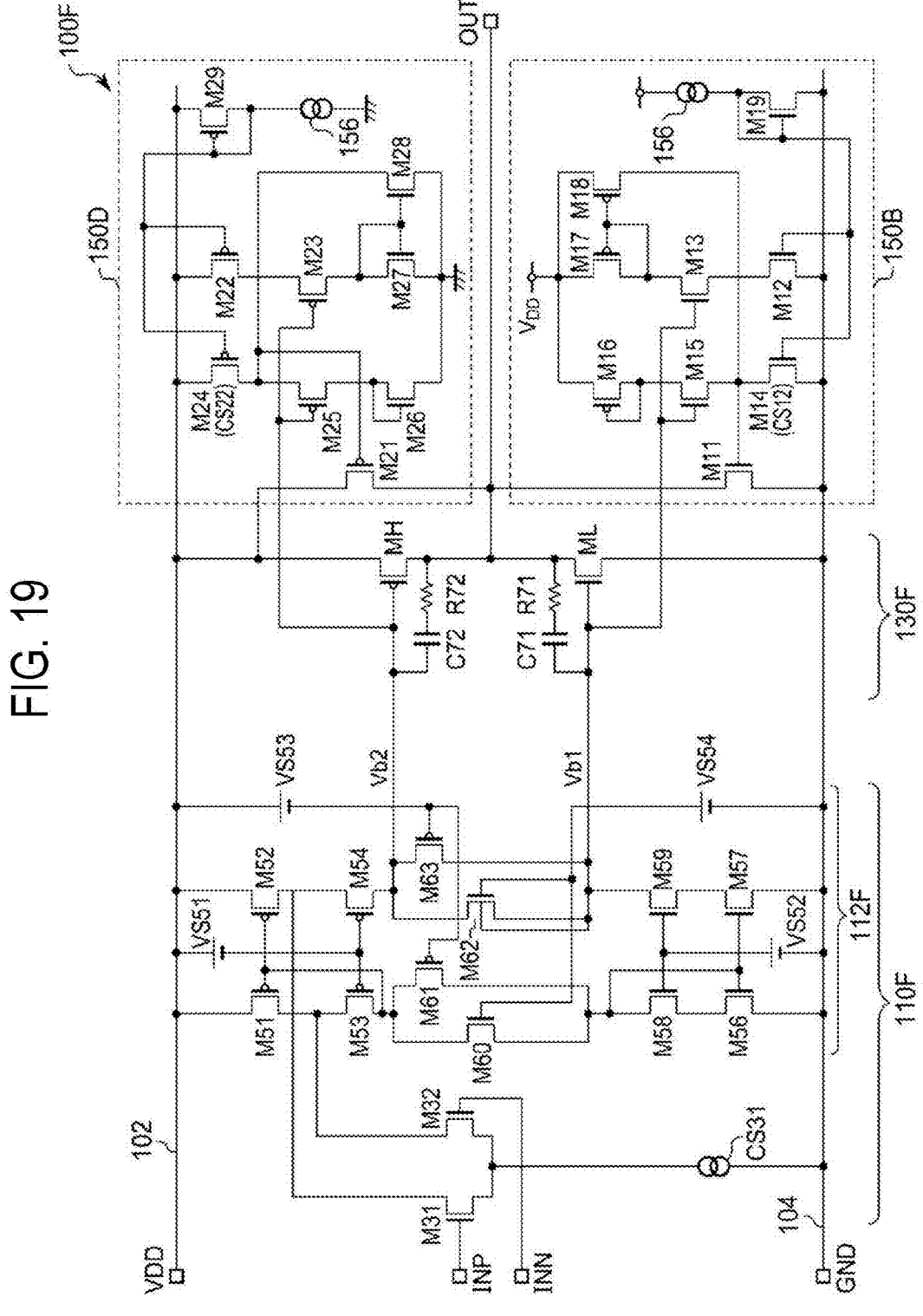
FIG. 19 is a circuit diagram of an operational amplifier according to a sixth embodiment.

FIG. 19 is a circuit diagram of an operational amplifier 100F according to a sixth embodiment. The operational amplifier 100F is a feedforward type high-speed operational amplifier and includes both the assist circuit 150B described in the second embodiment and the assist circuit 150D described in the fourth embodiment. The sixth embodiment is different from the fifth embodiment in the configurations of a differential input stage 110F and an amplification stage 130F.

The differential input stage 110F includes the differential transistor pair M31 and M32, the tail current source CS31, and a folded cascode amplifier circuit 112F. The folded cascode amplifier circuit 112F includes transistors M51 to M63 and voltage sources VS51 to VS54. The differential input stage 110F supplies two intermediate signals Vb1 and Vb2 according to an input voltage to the amplification stage 130F.

The amplification stage 130F includes the high-side transistor MH, the low-side transistor ML, capacitors C71 and C72, and resistors R71 and R72.

It should be noted that the above-described embodiments are examples, and it should be understood by those skilled in the art that various modifications are possible in combinations of components and processing processes. Such modifications will be described below.

(First Modification)

The configuration of the differential input stage 110 or the amplification stage 130 is not particularly limited. For example, although FIGS. 16 and 19 show the differential input stage 110 having the NMOS input, the differential input stage 110 may have a PMOS input or a rail-to-rail input having an NMOS input and a PMOS input.

(Second Modification)

The configuration of the amplification stage 130 is also not limited to those shown in FIGS. 16 and 19, and the present disclosure can be applied to known or future available configurations.

(Third Modification)

In the configurations of FIGS. 4 and 6, the first current source CS11 may source the current $I_A$ independent of the gate voltage $Vg_L$ of the low-side transistor ML to the gate of the transistor M11. The second current source CS12 may sink the current $I_B$ having the negative correlation with the gate voltage $Vg_L$ of the low-side transistor ML from the gate of the transistor M11. The current $I_B$ is equal to the current $I_A$ when the gate voltage $Vg_L$ is low, and decreases as the gate voltage $Vg_L$ increases.

(Fourth Modification)

In the configurations of FIGS. 5 and 7, the transistor M13 may be provided between a drain of the transistor M18 and the gate of the transistor M11.

(Fifth Modification)

In the configurations of FIGS. 10 and 12, the first current source CS21 may sink the current $I_A$ independent of the gate voltage $Vg_H$ of the high-side transistor MH from the gate of the transistor M21. The second current source CS22 may source the current $I_B$ having the negative correlation with the gate-source voltage $Vgs_H$ of the high-side transistor MH, that is, having the positive correlation with the gate voltage $Vg_H$ of the high-side transistor MH, to the gate of the transistor M21. The current $I_B$ is equal to the current $I_A$ when the gate-source voltage $Vgs_H$ of the high-side transistor MH is 0, and decreases as the gate-source voltage $Vgs_H$ increases.

(Sixth Modification)

In the configurations of FIGS. 11 and 13, the transistor M23 may be provided between a drain of the transistor M28 and the gate of the transistor M21.

According to the present disclosure in some embodiments, it is possible to provide an operational amplifier capable of achieving both low current consumption and high output current.

The embodiments merely shows the principle and application of the present disclosure, and many modifications and changes in arrangement are recognized in the embodiments without departing from the spirit of the present disclosure defined in the claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An operational amplifier comprising:
a differential input stage that amplifies a differential input signal to generate an intermediate signal;
an amplification stage including an output transistor that is connected between an output terminal and a fixed voltage line, and is driven according to the intermediate signal; and
an assist circuit,
wherein the assist circuit includes:
a first transistor connected in parallel with the output transistor; and
a drive circuit that drives the first transistor according to a gate voltage of the output transistor,
wherein the drive circuit includes a first current source and a second current source, wherein one end of the first current source and one end of the second current source are connected to a gate of the first transistor, and the other end of the second current source is connected to the fixed voltage line.

2. The operational amplifier of claim 1, wherein the output transistor is a low-side transistor of an N-channel MOSFET (Metal Oxide Semiconductor Field Effect Transistor), and the fixed voltage line is a ground line,
wherein the first current source sources a first current according to the gate voltage of the output transistor to the gate of the first transistor, and the second current source sinks a second current from the gate of the first transistor.

3. The operational amplifier of claim 2, wherein the first current source includes:
a second transistor that includes a source connected to the ground line and is biased to flow a constant current;
a third transistor that includes a gate connected to a gate of the low-side transistor and a source connected to a drain of the second transistor; and
a current mirror circuit that returns a current flowing through the third transistor to source the current to the gate of the first transistor.

4. The operational amplifier of claim 2, wherein the second current source includes a fourth transistor that includes a source connected to the ground line and a drain connected to the gate of the first transistor, and is biased to flow a constant current.

5. The operational amplifier of claim 2, wherein the drive circuit further includes a fifth transistor that includes a gate connected to a gate of the low-side transistor and a source connected to the gate of the first transistor.

6. The operational amplifier of claim 5, wherein the drive circuit further includes a sixth transistor that includes:
a gate and a drain connected to a drain of the fifth transistor; and
a source connected to a power supply line.

7. The operational amplifier of claim 1, wherein the output transistor is a P-type high-side transistor, and the fixed voltage line is a power supply line, and
wherein the first current source sinks a first current according to the gate voltage of the output transistor from the gate of the first transistor, and the second current source sources a second current to the gate of the first transistor.

8. The operational amplifier of claim 7, wherein the first current source includes:
a second transistor that includes a source connected to the power supply line and is biased to flow a constant current;
a third transistor that includes a gate connected to a gate of the high-side transistor and a source connected to a drain of the second transistor; and
a current mirror circuit that returns a current flowing through the third transistor to sink the current from the gate of the first transistor.

9. The operational amplifier of claim 7, wherein the second current source includes a fourth transistor that includes a source connected to the power supply line and a drain connected to the gate of the first transistor, and is biased to flow a constant current.

10. The operational amplifier of claim 7, wherein the drive circuit further includes a fifth transistor that includes a gate connected to a gate of the high-side transistor and a source connected to the gate of the first transistor.

11. The operational amplifier of claim 10, wherein the drive circuit further includes a sixth transistor that includes:

a gate and a drain connected to a drain of the fifth transistor; and a source connected to the ground line.

12. An operational amplifier comprising:

a differential input stage that amplifies a differential input signal to generate an intermediate signal;

an amplification stage including a low-side transistor that is connected between an output terminal and a ground line, and is driven according to the intermediate signal; and an assist circuit, wherein the assist circuit includes:

a first transistor connected in parallel with the low-side transistor;

a second transistor that includes a source connected to the ground line and is biased to flow a constant current;

a third transistor that includes a gate connected to a gate of the low-side transistor and a source connected to a drain of the second transistor;

a current mirror circuit that returns a current flowing through the third transistor to source the current to a gate of the first transistor; and a fourth transistor that includes a source connected to the ground line and a drain connected to the gate of the first transistor, and is biased to flow a constant current.

13. The operational amplifier of claim 12, wherein the assist circuit further includes:

a fifth transistor that includes a gate connected to the gate of the low-side transistor and a source connected to the gate of the first transistor; and a sixth transistor that includes:

a gate and a drain connected to a drain of the fifth transistor; and a source connected to a power supply line.

14. An operational amplifier comprising:

a differential input stage that amplifies a differential input signal to generate an intermediate signal;

an amplification stage including a high-side transistor that is connected between an output terminal and a power supply line, and is driven according to the intermediate signal; and an assist circuit, wherein the assist circuit includes:

a first transistor connected in parallel with the high-side transistor;

a second transistor that includes a source connected to the power supply line and is biased to flow a constant current;

a third transistor that includes a gate connected to a gate of the high-side transistor and a source connected to a drain of the second transistor;

a current mirror circuit that returns a current flowing through the third transistor to sink the current from a gate of the first transistor; and a fourth transistor that includes a source connected to the power supply line and a drain connected to the gate of the first transistor, and is biased to flow a constant current.

15. The operational amplifier of claim 14, wherein the assist circuit further includes:

a fifth transistor that includes a gate connected to the gate of the high-side transistor and a source connected to the gate of the first transistor; and a sixth transistor that includes:

a gate and a drain connected to a drain of the fifth transistor; and a source connected to a ground line.

16. The operational amplifier of claim 1, which is integrated on one semiconductor substrate.

* * * * *